(12) United States Patent
Kato et al.

(10) Patent No.: US 7,248,504 B2
(45) Date of Patent: Jul. 24, 2007

(54) DATA PROCESSING DEVICE

(75) Inventors: Akira Kato, Tachikawa (JP); Toshihiro Tanaka, Akiruno (JP); Takashi Yamaki, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 135 days.

(21) Appl. No.: 11/140,741

(22) Filed: Jun. 1, 2005

(65) Prior Publication Data

US 2005/0270851 A1     Dec. 8, 2005

(30) Foreign Application Priority Data

Jun. 2, 2004     (JP)     ............................. 2004-164647

(51) Int. Cl.
*G11C 11/34* (2006.01)
(52) U.S. Cl. ........................ 365/185.29; 365/185.15; 365/185.05
(58) Field of Classification Search ........... 365/185.29, 365/185.05, 185.15
See application file for complete search history.

(56) References Cited

U.S. PATENT DOCUMENTS 5,912,843 A * 6/1999 Jeng ........................ 365/185.14
2004/0257871 A1* 12/2004 Swift et al. ................. 365/174

FOREIGN PATENT DOCUMENTS

JP          2003-46002         2/2003

OTHER PUBLICATIONS

T. Tanaka et al. , "A 512kB MONOS type Flash Memory Module Embedded in a Microcontroller," 2003 Symposium on VLSI Circuits Dig., pp. 211-212.

* cited by examiner

*Primary Examiner*—Richard T. Elms
*Assistant Examiner*—Pho M. Luu
(74) *Attorney, Agent, or Firm*—Miles & Stockbridge

(57) ABSTRACT

A data processing device which selects either emission of electrons from a nonvolatile memory cell or injection of electrons into it for each bit. A memory array includes a plurality of nonvolatile memory cells each having a pair of a first MOS transistor and a second MOS transistor where the first transistor has a charge retention layer and a memory gate and is used for data storage and the second transistor has a control gate and selectively connects the first transistor to a bit line. When negative voltage is applied to a memory gate, electrons held by a charge retention layer are emitted through hot carriers generated in a nonvolatile memory cell channel region for erasing; and when positive voltage is applied to the memory gate, electrons are injected into the charge retention layer through hot carriers generated in the nonvolatile memory cell channel region for writing and controls the generation and suppression of hot carriers by means of bit line voltage on each bit line.

7 Claims, 19 Drawing Sheets

(STORAGE OF READ DATA IN LATCHES)

(WRITE)

(ERASE)

(WRITE)

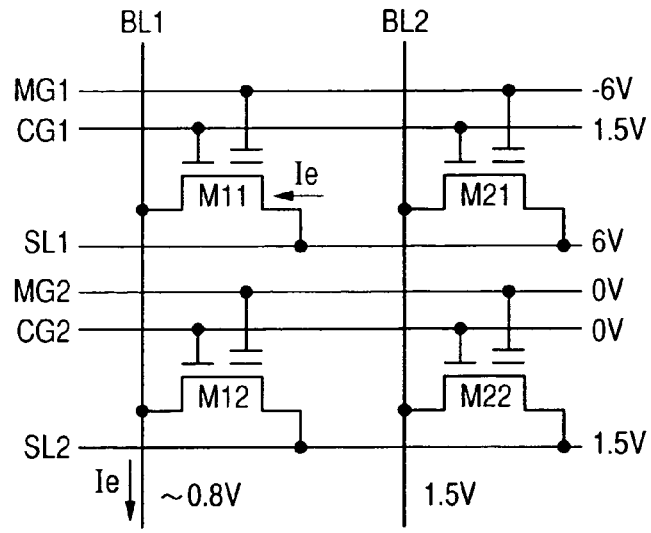
FIG. 7 (ERASE)
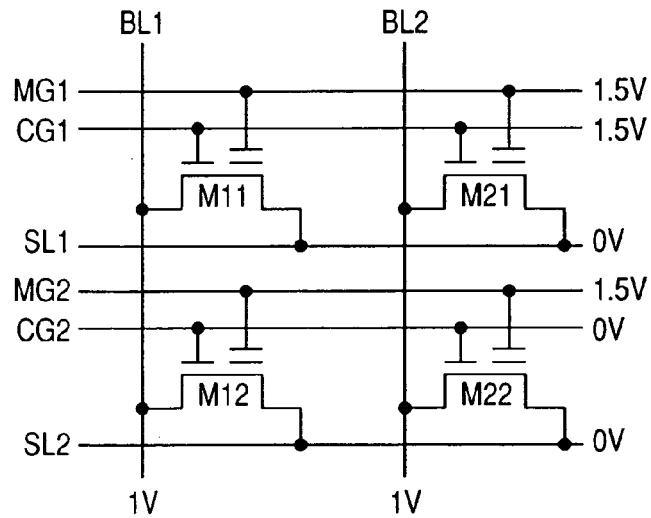
FIG. 8 (READ)
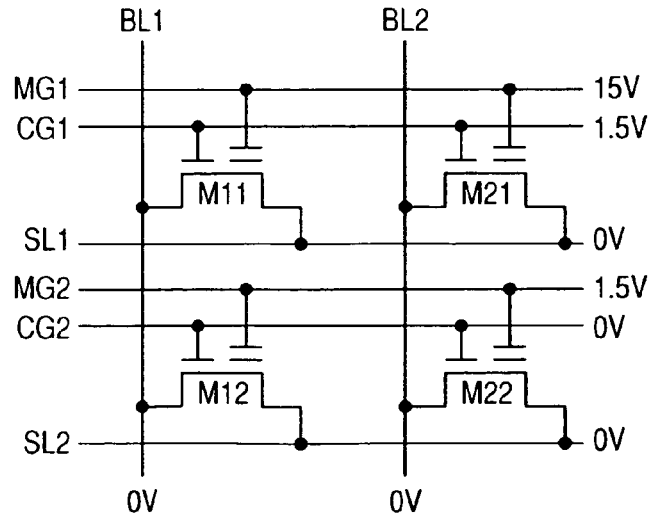
FIG. 9 (ERASE-COMPARATIVE EXAMPLE)

(WRITE-
COMPARATIVE
EXAMPLE)

(ERASE-
COMPARATIVE
EXAMPLE)

(READ-
COMPARATIVE
EXAMPLE)

(WRITE)

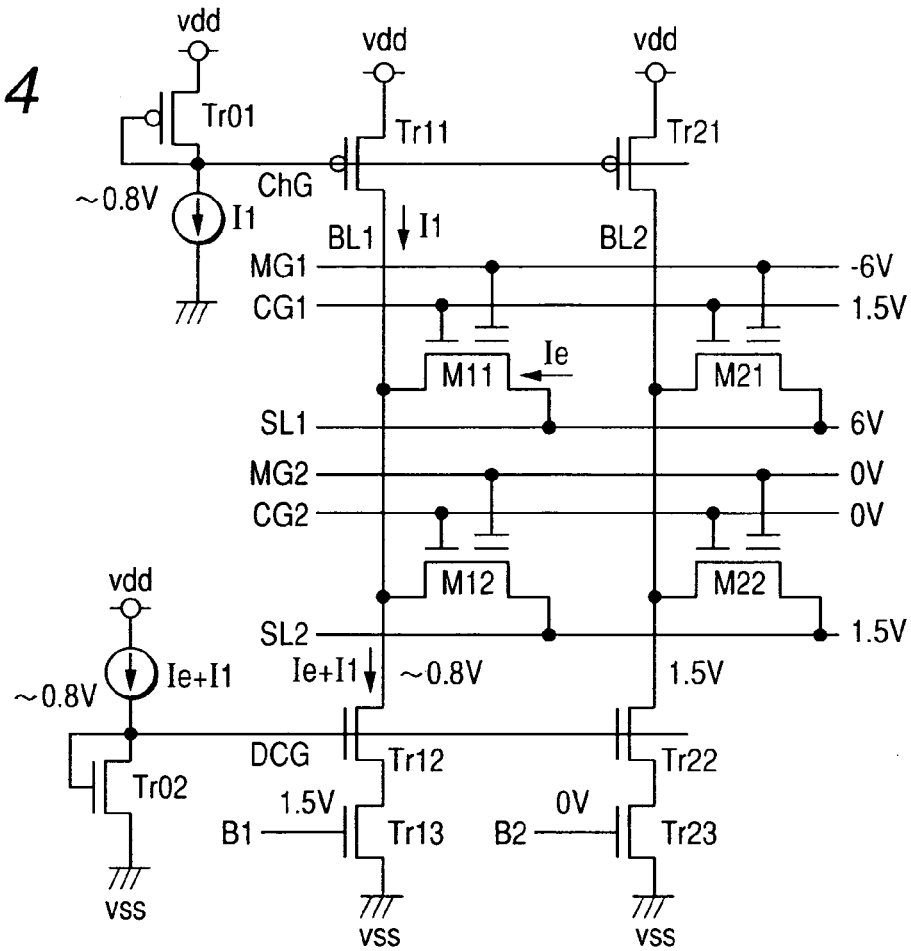
FIG. 14 (ERASE)
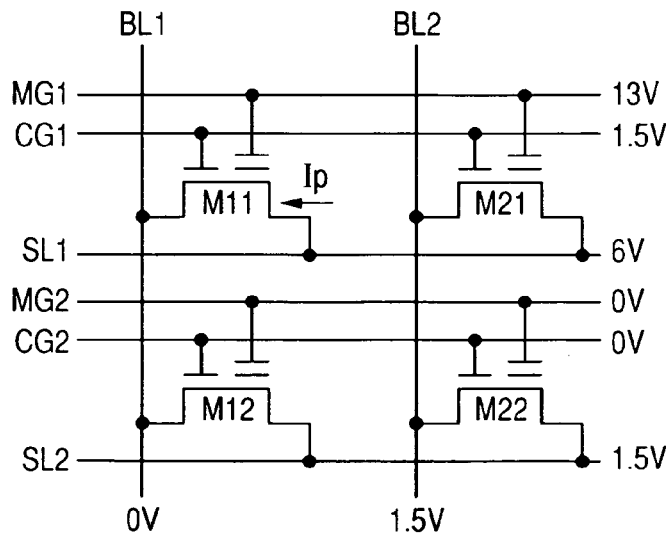
FIG. 15 (WRITE)

(ERASE)

(WRITE)

(ERASE)

(STORAGE OF READ DATA IN LATCHES)

(INPUT OF NEW DATA)

FIG. 21 (ERASE)

(WRITE)

FIG. 23 (READ)

(WRITE)

(ERASE)

DATA PROCESSING DEVICE

CROSS-REFERENCE TO RELATED APPLICATION

The present application claims priority from Japanese patent application No. 2004-164647 filed on Jun. 02, 2004, the content of which is hereby incorporated by reference into this application.

BACKGROUND OF THE INVENTION

The present invention relates to a data processing device which incorporates a nonvolatile memory having a memory array and a controller and more particularly to technology which is useful for a microcomputer incorporating a flash memory.

Non-patent Document 1 (T. Tanaka et al., A 512 kB MONOS type Flash Memory Module Embedded in a Microcontroller, 2003 Symposium on VLSI Circuits Dig., p211, 212) describes a 2-transistor MONOS (Metal Oxide Nitride Oxide Semiconductor) nonvolatile memory. This nonvolatile memory cell includes a control transistor and a memory transistor where the control transistor employs the same gate withstand voltage (gate oxide film thickness) as a 1.5 V MOS transistor used in a CPU. The control transistor is connected with a bit line (for the sake of convenience, the electrode of a nonvolatile memory cell connected with a bit line is called a drain) and the memory transistor is connected with a source line (for the sake of convenience, the electrode of a nonvolatile memory cell connected with a source line is called a source). For writing, high voltage is given to the source side to use source-side hot-electron injection. The control transistor gate (control gate) is fixed at 1.5 V and writing is controlled by drain-side voltage on a bit-by-bit basis. For erasing, tunneling is used to pull out electrons toward the memory transistor gate (memory gate). Erasing is concurrently done on plural memory cells which share a memory gate. Reading does not require voltage higher than 1.5 V. The region which is activated for reading should consist of a 1.5 V MOS transistor. This is because in erasing and writing, high voltage is applied to source lines and memory gates but not to bit lines.

Patent Document 1 (Japanese Unexamined Patent Publication No. 2003-46002) also describes a 2-transistor MONOS nonvolatile memory though a control transistor is connected with a source line and a memory transistor is connected with a bit line. Source-side hot-electron injection is used for writing and hot holes generated at the bit line drain side are injected for erasing. Writing and erasing are controlled by drain-side voltage on a bit-by-bit basis. Hence, it is necessary to apply high voltage to the bit line side.

SUMMARY OF THE INVENTION

In the technology described in Non-patent Document 1, nonvolatile memory cells which share a memory gate are all erased and therefore the memory gates must be divided and independently controlled in order to make units of rewriting smaller. Since 10 V or more is applied to memory gates, high-voltage MOS transistors must be used, requiring a larger area for layout.

In the technology described in Patent Document 1, bit lines must be selectively set to a high voltage (5 V or so) and therefore the bit line driver must consist of a high-voltage MOS transistor, requiring a larger area for layout.

The primary object of the present invention is to provide a data processing device which selectively performs emission of electrons from, and injection of electrons into, a nonvolatile memory cell for each bit.

The above and further objects and novel features of the present invention will more fully appear from the description in this specification and the accompanying drawings.

Typical preferred embodiments of the present invention will be briefly outlined next.

[1] According to one aspect of the invention, a data processing device (15) has a nonvolatile memory (17) with a memory array (18) and a controller (19). The memory array includes a plurality of nonvolatile memory cells each having a pair of a first MOS transistor (Trm) and a second MOS transistor (Trc) where the first transistor has a charge retention layer and a memory gate and is used for data storage and the second transistor has a control gate and selectively connects the first transistor to a bit line. The controller enables emission of electrons held by a charge retention layer through hot carriers generated in a nonvolatile memory cell channel region by application of negative voltage to a memory gate and enables injection of electrons into a charge retention layer through hot carriers generated in a nonvolatile memory cell channel region by application of positive voltage to a memory gate and controls the generation and suppression of hot carriers by means of bit line voltage on each bit line.

In the above system, the bit line voltage required for generation and suppression of hot carriers can be determined in relation to the voltage level of the control gate of the second transistor and need not be high. Electrons and holes are generated by the action of hot carriers and the orientation of an electric field affecting these electrons and holes is determined by the polarity of high voltage of the memory gate with respect to the potential of the drain or source electrode of the first transistor. Therefore, it is unnecessary to apply high voltage to the bit line to control the threshold voltage of the nonvolatile memory cell. In addition, since the generation and suppression of hot carriers can be controlled by the bit line voltage on each bit line, either emission of electrons from the nonvolatile memory cell or injection of electrons into the nonvolatile memory cell can be selected for each bit and concurrently performed on nonvolatile memory cells which share a memory gate. This makes it possible to selectively write or erase bits on a bit-by-bit basis without the need for a high voltage circuit on the bit line side.

Next, a concrete system for controlling the generation and suppression of hot carriers by bit line voltage on each bit line will be explained. According to another aspect of the invention, a first system has data latch circuits (DL11–DLn1) which correspond to bit lines for plural nonvolatile memory cells connected with a memory gate as mentioned above. Here, for data rewriting, the controller enables stored data in a nonvolatile memory cell to be latched by the data latch circuit through a bit line and updates, among the latched stored data, data to be rewritten with newly written data and controls generation and suppression of hot carriers for a corresponding nonvolatile memory cell according to the logical value of each bit of the updated latched data. In the first system, it is necessary to read stored data into the data latch circuit and because erasing or writing operation is based on the logical values of data bits latched by the data latch circuits, writing or erasing is done even on nonvolatile memory cells for which writing or erasing is unnecessary.

According to another aspect of the invention, a second system has a first data latch circuit (DL14 . . . ) and a second data latch circuit (DL13 . . . ) which corresponds to a bit on a bit line for plural nonvolatile memory cells connected with a memory gate as mentioned above. In this system, for data rewriting, the controller enables the first data latch circuit and second data latch circuit to latch stored data in a nonvolatile memory cell through a bit line, then updates the data to be rewritten, among the data latched by the second data latch circuit, with newly written data and allows generation of hot carriers for a nonvolatile memory cell which corresponds to a bit for which the updated data latched by the second data latch circuit and the data latched by the first data latch circuit do not agree. This solves the problem that erasing or writing is done on nonvolatile memory cell for which erasing or writing is unnecessary.

According to another aspect of the invention, a third system has a first data latch circuit (DL16 . . . ) and a second data latch circuit (DL15 . . . ) which corresponds to a bit on a bit line for plural nonvolatile memory cells connected with a memory gate as mentioned above. In this system, for data rewriting, the controller initializes the first data latch circuit and the second data latch circuit to a first logical value for each bit and updates the data to be rewritten, in the initialized first data latch circuit, with newly written data, and updates the data to be rewritten, in the initialized second data latch circuit, to a second logical value, and allows generation of hot carriers for a nonvolatile memory cell corresponding to a bit for which the updated data latched by the second data latch circuit and the data latched by the first data latch circuit agree, namely both have the second logical value. This eliminates the need for reading stored data into data latch circuits, which solves the problem that erasing or writing is done on nonvolatile memory cell for which erasing or writing is unnecessary.

According to another aspect of the invention, the data processing device further has a logical unit (16) which can access the nonvolatile memory. When accessing the nonvolatile memory for writing, the logical unit gives the nonvolatile memory a destination address for writing, write data and a writing operation command.

According to another aspect of the invention, for rewriting stored data in nonvolatile memory cells, the controller omits the step of reading stored data from nonvolatile memory cells to be rewritten and suppresses generation of hot carriers for nonvolatile memory cells not to be rewritten, as indicated by address information.

[2] According to another aspect of the invention, a data processing device has a nonvolatile memory with a memory array and a controller. The memory array includes a plurality of nonvolatile memory cells each having a pair of a first MOS transistor and a second MOS transistor where the first transistor has a charge retention layer and a memory gate and is used for data storage and the second transistor has a control gate and selectively connects the first transistor to a bit line. The controller controls the bit line potential level to decide whether to supply electric current between the drain and source of the nonvolatile memory cell and controls the polarity of high voltage applied to the memory gate to select either emission of electrons from, or injection of electrons into, the charge retention layer of a nonvolatile memory cell to which the current is supplied.

As described above, it is unnecessary to apply high voltage to the bit line for control of the threshold voltage of a nonvolatile memory cell. In addition, since whether to supply current between the drain and source of the nonvolatile memory cell is controlled by means of the bit line potential level, both emission of electrons into the nonvolatile memory cell and injection of electrons into it can be performed for each bit. This makes it possible to selectively write or erase bits on a bit-by-bit basis without the need for a high voltage circuit on the bit line side.

According to another aspect of the invention, the bit line potential of a nonvolatile memory cell in which current flows between its drain and source is relatively low, and the bit line potential of a nonvolatile memory cell in which such current does not flow is relatively high. In the former case, the control transistor will turn on, and in the latter case it will turn off.

According to another aspect of the invention, the memory gate of a nonvolatile memory cell for which the emission of electrons is selected has a high negative voltage and the memory gate of a nonvolatile memory cell for which the injection of electrons is selected has a high positive voltage. In the former case, electrons will be injected from the substrate into the charge retention layer, and in the latter case, electrons will be emitted from the charge retention layer to the memory gate.

According to another aspect of the invention, the bit line potential level may be determined according to the logical value of data read from a nonvolatile memory cell and the logical value of write data. However, it is necessary to read stored data from nonvolatile memory cells before rewriting.

According to another aspect of the invention, the bit line potential level may be determined according to address information indicating a nonvolatile memory cell to be rewritten and write data. Here it is possible that the cells to be rewritten are identified by address information and defined with write data and the other cells are fixed to a logical value which suppresses the current between the drain and source of a nonvolatile memory cell. This makes it unnecessary to read stored data from nonvolatile memory cells before rewriting.

According to another aspect of the invention, the data processing device further includes a data processing unit which can access the nonvolatile memory and an internal bus which connects the nonvolatile memory and the data processing unit where the nonvolatile memory is located in address space of the data processing unit. Furthermore, the nonvolatile memory holds an operation program for the data processing unit. The nonvolatile memory also holds data which the data processing unit uses.

[3] According to another aspect of the invention, a data processing device has a nonvolatile memory with a memory array and a controller. The memory array includes a plurality of nonvolatile memory cells each having a pair of a first MOS transistor and a second MOS transistor where the first transistor has a charge retention layer and a memory gate and is used for data storage and the second transistor has a control gate and selectively connects the first transistor to a bit line. The controller controls the bit line potential level to decide whether to generate or suppress current between the drain and source of a nonvolatile memory cell and also determines the threshold voltage of the nonvolatile memory cell by differentiating the polarity of high voltage applied to a memory gate to control the orientation of an electric field which affects the charge retention layer.

A major advantage offered by the present invention is briefly outlined as follows: either emission or injection of electrons from or into a nonvolatile memory cell can be selected for each bit.

BRIEF DESCRIPTION OF THE DRAWINGS

The invention will be more particularly described with reference to the accompanying drawings, in which:

FIG. 7 is a circuit diagram showing a typical memory array configuration, focusing on erasing;

FIG. 8 is a circuit diagram showing a typical memory array configuration, focusing on reading;

FIG. 9 is a circuit diagram showing an erasing method according to a comparative example;

FIG. 14 is a circuit diagram showing a more concrete memory array configuration, focusing on erasing;

FIG. 15 is a circuit diagram showing another concrete memory array configuration, focusing on writing;

DETAILED DESCRIPTION OF THE PREFERRED EMBODIMENTS

Figure 1:
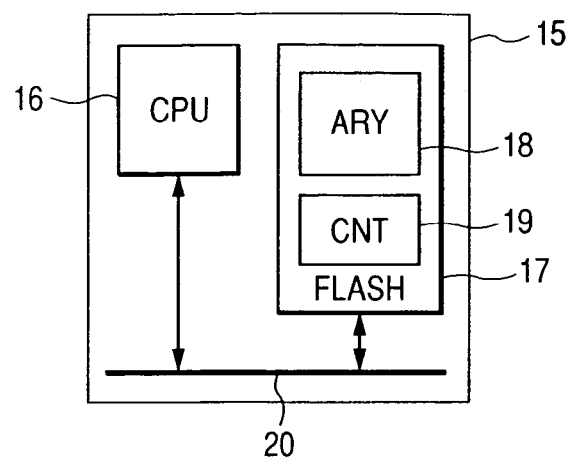
FIG. 1 is a block diagram showing a microcomputer according to an embodiment of the present invention.

FIG. 1 shows a microcomputer according to an embodiment of the present invention. The microcomputer 15 includes, though not limited thereto, a central processing unit (CPU) 16 as a data processing unit and a flash memory (FLASH) 17, a nonvolatile memory, which are mounted on a semiconductor substrate of monocrystal silicon or similar material. The CPU 16 can access the flash memory 17 through a bus 20. The flash memory 17 has a memory array (ARY) 18 as a matrix of nonvolatile memory cells and a controller (CNT) 19.

Figure 2:
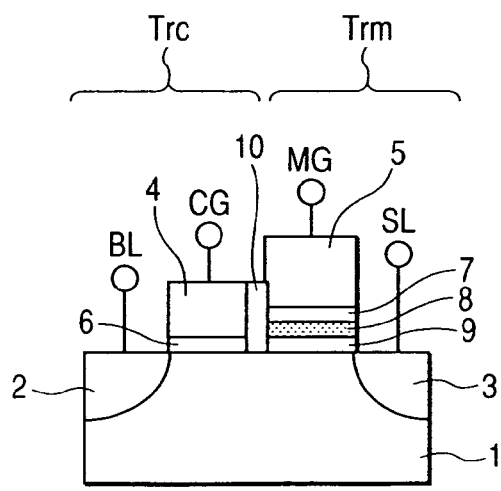
FIG. 2 is a sectional view showing the sectional structure of a nonvolatile memory cell.

FIG. 2 shows the cross-sectional configuration of a nonvolatile memory cell. The nonvolatile memory cell has a so-called split gate type configuration where a pair of transistors, namely a MOS first transistor (hereinafter called simply the memory transistor) Trm for data storage and a MOS second transistor Trc for selectively making the memory transistor Trm conductive to bit line BL (hereinafter called simply the control transistor), are provided in a p-well region 2 of a silicon substrate.

Figure 3:
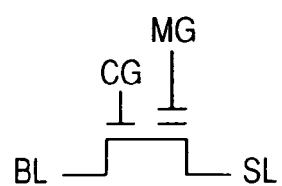
FIG. 3 shows nonvolatile cell circuit symbols.

The memory transistor Trm has: an n-type diffusion layer (n-type impurity region) 3 as a source line electrode which is connected to source line SL; a charge retention layer (for example, silicon nitride film) 8; insulating films 7 and 9 provided over the front and reverse sides of the charge retention layer 8 (for example, silicon oxide films); and a memory gate electrode (for example, n-type polysilicon layer) 5 (MG) for applying high voltage for writing and erasing. The control transistor Trc has: an n-type diffusion layer (n-type impurity region) 2 as a bit line electrode which is connected to bit line BL; a gate insulating film (for example, silicon oxide film) 6; and a control gate electrode (for example, n-type polysilicon layer) 4 (CG). Numeral 10 represents a sidewall insulating film for insulation between the gate electrodes of both the transistors Trm and Trc. The charge retention layer 8 of the memory transistor Trm and the insulating layers 9 and 7 on the front and reverse sides of it (collectively called memory gate insulating film) are thicker than the gate insulating film 6 of the control transistor Trc; and thus the memory transistor Trm can resist high voltage. The control transistor Trc has the same gate insulating film thickness as the logic MOS transistor as a constituent of the CPU and both are produced by the same process. For the sake of convenience, the source line electrode 3 is called the source of the nonvolatile memory cell, and the bit line electrode 2 called the drain of the nonvolatile memory cell. FIG. 3 shows nonvolatile memory cell circuit symbols.

Figure 4:
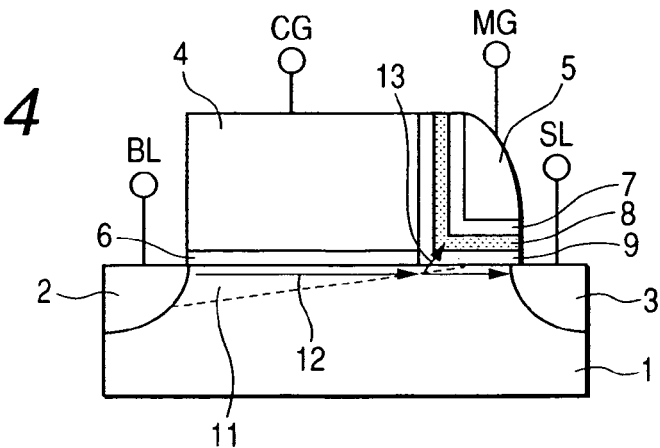
FIG. 4 is a sectional view showing the actual sectional structure of a nonvolatile memory cell, focusing on writing.
Figure 5:
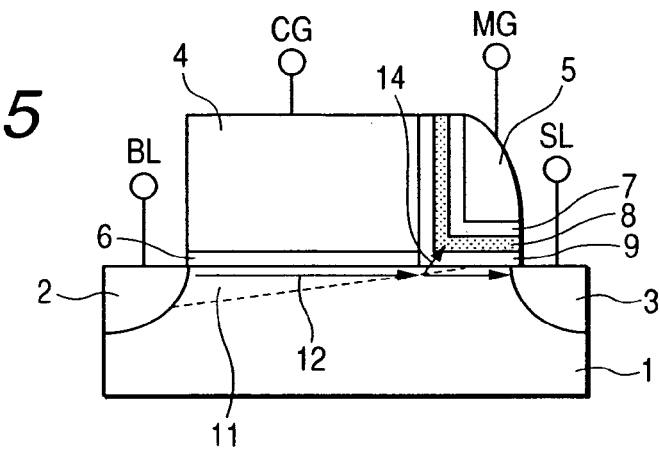
FIG. 5 is a sectional view showing the actual sectional structure of a nonvolatile memory cell, focusing on erasing.

FIGS. 4 and 5 show the actual sectional configuration of the nonvolatile memory cell, where FIG. 4 focuses on writing and FIG. 5 focuses on erasing. The same elements as those in FIG. 2 are designated by the same reference numerals and symbols. The nonvolatile memory cell stores 1-bit data by having a relatively low threshold voltage or a relatively high threshold voltage, though not limited thereto.

A relatively high threshold voltage is produced, for example, in a state that more electrons are injected into the charge retention layer 8 than in the thermal equilibrium state. This state is called simply "write state" and producing this state is called "write". A relatively low threshold voltage is produced, for example, in a state that more electrons are emitted from the charge retention layer 8 than in the thermal equilibrium state. This state is called simply "erase state" and producing this state is called "erase". As viewed from another angle, "erase" can be expressed as injection of holes into the charge retention layer. The expression "injection of holes" may be used to distinguish from a case that emission of electrons stops before thermal equilibrium is reached.

As shown in FIGS. 4 and 5, when electric current flows between the drain 2 and source 3 with high voltage applied on the source 3, a high electric field is generated between channel ends at both sides of the sidewall insulating layer and hot carriers are generated. Since the sidewall insulating layer 10 separates the memory gate electrode 5 of the memory transistor Trm and the control gate electrode 4 of the control transistor Trc, the channel beneath the control transistor Trc is controlled by the voltage of the control gate electrode 4. Therefore, even when high voltage is applied to the source 3, if the voltage of the control gate electrode 4 is, for example, 0 V, there is no conductivity between the channel beneath the memory transistor Trm and the channel beneath the control transistor Trc. In order to make the channel beneath the memory transistor Trm and the channel beneath the control transistor Trc conductive to each other and permit electric current flow between the drain 2 and the source 3, the voltage of the control gate electrode 4 should be, for example, 1.5 V. In the figures, 11 represents a channel and 12 electrons. When hot carriers thus generated collide against Si atoms, holes and electrons are generated. By changing the voltage of the memory gate 5 to positive or negative, the generated holes or electrons can be selectively injected into the charge retention layer. For example, for writing, the memory gate 5 is set to 13 V and the source 3 is set to 6V and electrons 13 are injected into the charge retention layer; for erasing, the memory gate 5 is set to −6 V and the source 3 is set to 6V and holes 14 are injected into the charge retention layer. "Injection of holes into the charge retention layer" means that electrons in the charge retention layer are accelerated by a high electric field between the memory gate 5 and the source 3, recombined with holes and emitted. When no current flows between the drain 2 and the source 3, no hot carriers are generated and holes or electrons which are injected into the charge retention layer are not generated. Therefore, simply by changing the voltage of the drain 2, writing and erasing can be done concurrently on plural nonvolatile memory cells which share the source 3 (SL), control gate 4 (CG) and memory gate 5 (MG) bit by bit.

Figure 6:
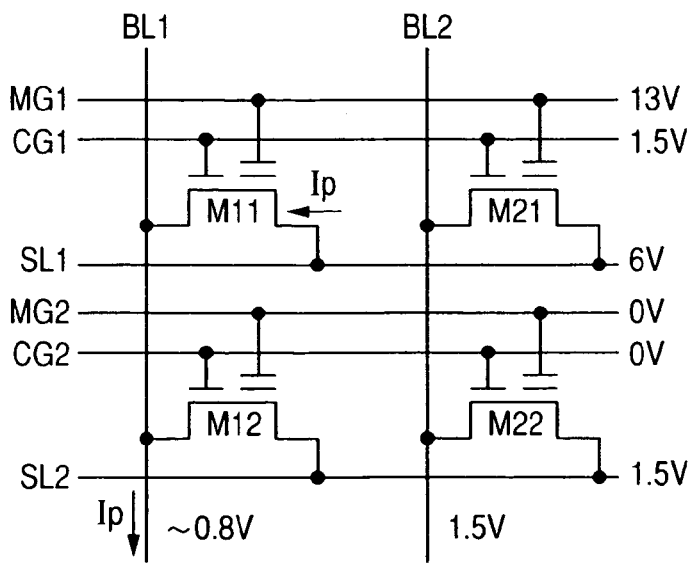
FIG. 6 is a circuit diagram showing a typical memory array configuration, focusing on writing.

FIGS. 6 and 7 show a typical memory array configuration, where FIG. 6 focuses on writing and FIG. 7 focuses on erasing. In these figures, four nonvolatile memory cells M11, M12, M21, M22 are typically shown. MGi (i is a positive integer) represents a memory gate line connected with the memory gates of nonvolatile memory cells arranged in a row; CGi a control gate line connected with the control gates of nonvolatile memory cells arranged in a row; SLi a source line connected with the sources of nonvolatile memory cells arranged in a row; and BLi a bit line connected with the drains of nonvolatile memory cells arranged in a column. As illustrated in FIGS. 6 and 7, in both writing and erasing, the bit line BLi to be connected with the drain of the memory cell M11 concerned (or to be processed) is set between 0–0.8 V; the source line SLi to be connected with the source 3 is set to 6 V; the control gate line CGi to be connected with the control gate 4 is set to 1.5 V; and the potential of the substrate is set to 0 V. This is a condition necessary for current to flow between the drain and source of the nonvolatile memory cell M11 concerned in writing or erasing. In the figures, current which flows for writing is expressed by Ip and current which flows for erasing is expressed by Ie.

In writing under this condition, namely when electrons are to be injected into the charge retention layer, the voltage of the memory gate line MG1 to be connected with the memory gate 5 of the memory transistor Trm should be positive and high, for example 13 V. On the other hand, in erasing, namely when holes are to be injected into the charge retention layer (electrons are emitted from the charge retention layer), the voltage of the memory gate MG1 should be negative and high, for example −6 V. When no writing or erasing is to be performed, the bit line BLi to be connected with the drain 2 should be 1.5 V so that the control transistor Trc is off and no current flows between the drain and source of the nonvolatile memory cell.

FIG. 8 typically shows a memory array condition for reading operation. Here, all bit lines BLi are precharged to 1 V and all source lines are set to 0 V. The control gate line CG1 shared by nonvolatile memory cells to be read is set to a control transistor selected level (for example, 1.5 V) and the other control gate lines CGi are set to a non-selected level (for example, 0 V). The memory gate lines MGi are set to 1.5 V.

FIG. 9 shows an erasing method according to a comparative example. This method also uses split-gate type nonvolatile memory cells as in FIG. 2. The erasing method shown in FIG. 9 employs tunneling where electrons are pulled out toward the memory transistor gate (memory gate) side. Erasing is concurrently done on plural memory cells which share a memory gate line. It is impossible to control whether to erase or not, on a bit-by-bit basis.

Figure 10:
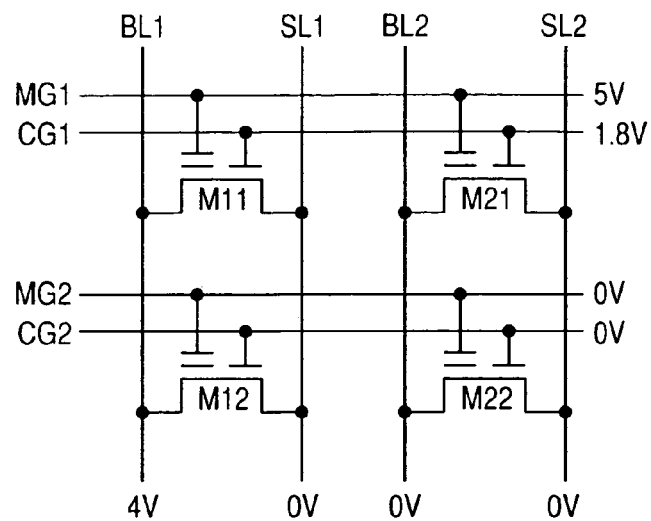
FIG. 10 is a circuit diagram showing a writing method according to another comparative example.
Figure 11:
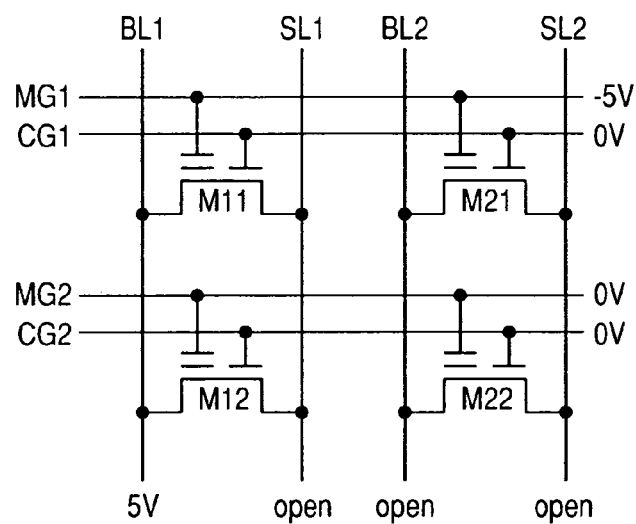
FIG. 11 is a circuit diagram showing an erasing method according to another comparative example.
Figure 12:
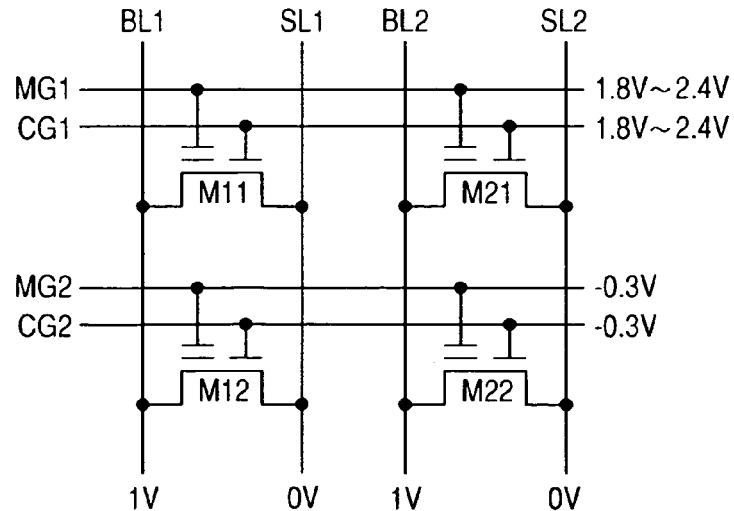
FIG. 12 is a circuit diagram showing a reading method according to another comparative example.

FIGS. 10, 11 and 12 respectively show writing, erasing and reading methods according to another comparative example. Here, although split-gate type MONOS nonvolatile memory cells are used again, control transistors are connected with source lines and memory transistor are connected with bit lines. For writing, source side hot electron injection is employed and for erasing, hot holes generated at the bit line drain side are injected. Drain side voltage is used to control both writing and erasing, bit by bit. Hence, it is necessary to apply high voltage to the bit line side.

Figure 13:
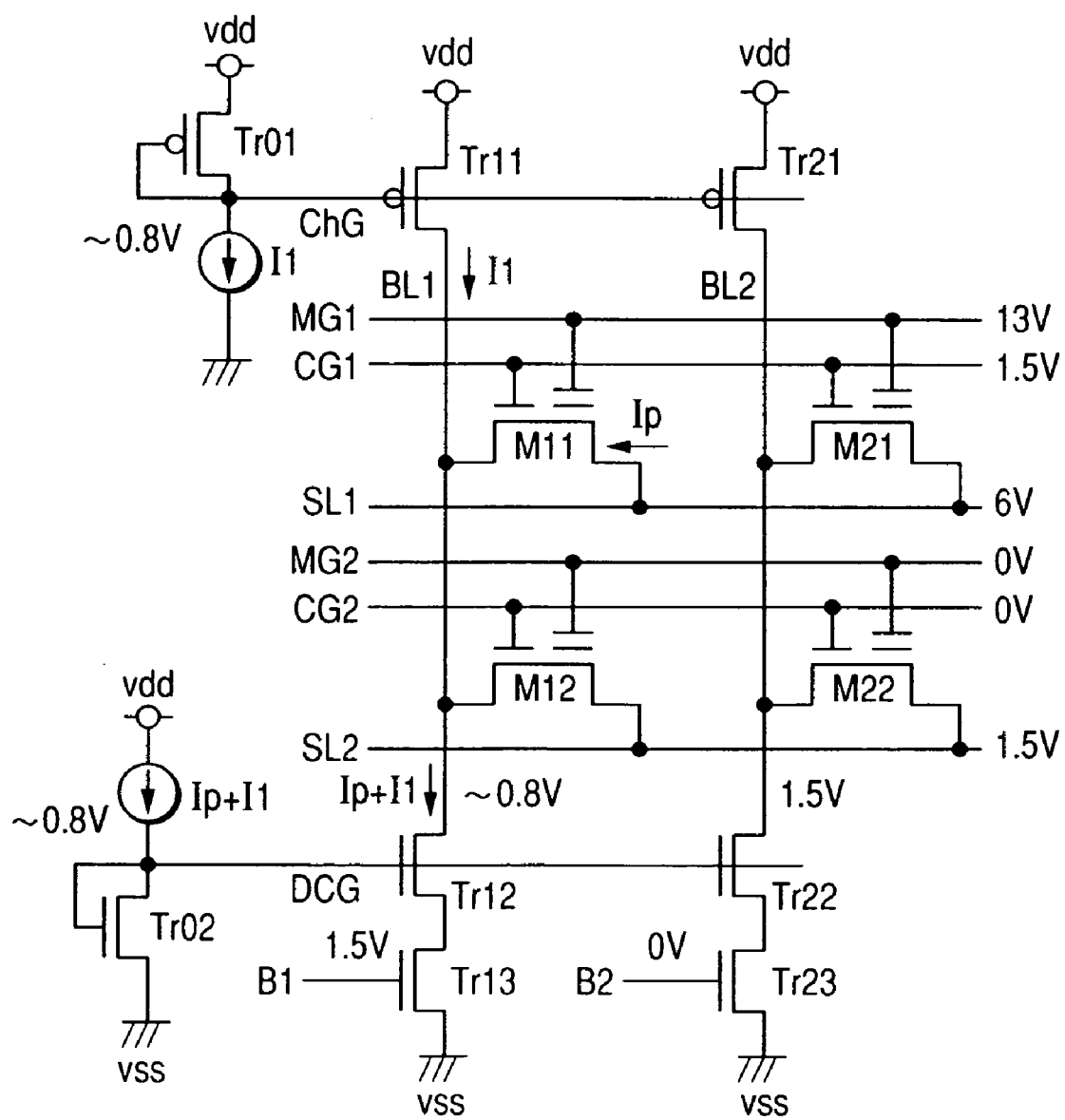
FIG. 13 is a circuit diagram showing a more concrete memory array configuration, focusing on writing.

FIGS. 13 and 14 show a more concrete memory array configuration, where FIG. 13 focuses on writing and FIG. 14 focuses on erasing. The difference from FIGS. 6 and 7 is that the configuration for determining the bit line potential is concretely illustrated. As in FIGS. 6 and 7, a source line SLi is provided with nonvolatile memory cells in each row. The number of source lines can be smaller than when as many source lines as bit lines are provided with nonvolatile memory cells in each column, which contribute to reduction in the area required for layout with source lines and source line drivers.

On bit lines BLi, p-channel charge MOS transistors Tr 11 and Tr 21 and p-channel discharge MOS transistors Tr 12 and Tr 22 are respectively connected in series. Current flowing through a constant-current transistor Tr01 can be mirrored in the MOS transistors Tr11 and Tr21 by a current mirror circuit. Likewise, current flowing through a constant-current transistor Tr02 can be mirrored in the MOS transistors Tr12 and Tr22 by a current mirror circuit. The discharge MOS transistors Tr12 and Tr 22 are respectively connected in series with selection MOS transistors Tr13 and Tr23 which are switched according to selection signals B1 and B2.

For writing (erasing), selection signal B1 is set to 1.5 V to supply current to the bit line BL1 connected with the nonvolatile memory cell M11 concerned in writing (erasing). In order not to supply current to the bit line connected with the nonvolatile memory cell M21 unconcerned in writing (erasing), selection signal B2 is set to 0 V. Whether to write (erase) or not can be arbitrarily selected for each bit by the level of selection signals B1 and B2.

For writing (erasing), the control gate line CG1 connected with the nonvolatile memory cell M11 concerned in writing (erasing) is set to 1.5 V and the control gate line CG2 unconcerned in writing (erasing) is set to 0 V. For writing, the memory gate line MG1 connected with the nonvolatile memory cell M11 concerned in writing is set to 13 V and the memory gate line MG2 unconcerned in writing is set to 0 V. For erasing, the memory gate line MG1 connected with the nonvolatile memory cell M11 concerned in erasing is set to −6 V and the memory gate line MG2 unconcerned in erasing is set to 0 V. For writing (erasing), the source line SL1 connected with the nonvolatile memory cell M11 concerned in writing (erasing) is set to 6 V and the source line SL2 unconcerned in writing (erasing) is to 1.5 V for the purpose of disturbance reduction though it is acceptable to set it to 0 V.

The bit line BL1 is connected to supply voltage vdd through the transistor Tr11 and the bit line BL2 is also connected to it through the transistor Tr21. Considerable current leakage from plural memory cells connected on a bit line might cause an undesirable drop in the potential of bit line BLi and cause current to flow through nonvolatile memory cells unconcerned in writing/erasing. The transistors Tr 11 and Tr 21 are intended to prevent miswriting or mis-erasing due to such current leakage and supply charge current Ii to bit line BLi. When the voltage of the common gate ChG for the transistors Tr11 and Tr21 is controlled in a way for the current Ii to have the same temperature characteristics as leak current, miswriting or mis-erasing is more unlikely to occur.

The bit line BL1 is connected to grounding voltage vss through the transistors Tr12 and Tr13 and the bit line BL2 is connected to grounding voltage vss through the transistors Tr22 and Tr23. The transistors Tr12 and Tr22 are also intended to maintain constant the current Ip (Ie) flowing through nonvolatile memory cells concerned in writing (erasing), and to reduce variation in writing (erasing) characteristics caused by writing (erasing) at a constant current. When the voltage of the common gate DCG for the transistors Tr12 and Tr22 is so controlled as to maintain Ip (Ie) constant regardless of temperature, variation in writing (erasing) characteristics is properly reduced.

The transistors Tr13 and Tr23 are respectively switched (controlled) by selection signals B1 and B2.

Since the memory cells M11 and M21 in a row share the control gate line CG1, memory gate line MG1 and source line SL1, writing or erasing can be concurrently done on the memory cells M11 and M12 in the row.

Figure 16:
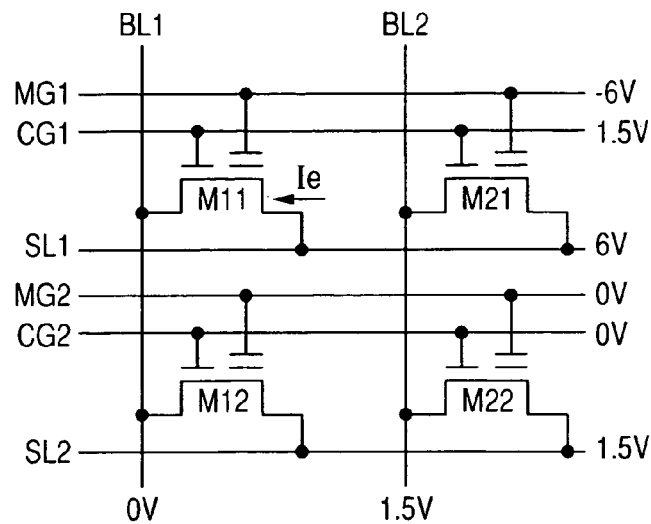
FIG. 16 is a circuit diagram showing another concrete memory array configuration, focusing on erasing.

FIGS. 15 and 16 show another example of a concrete memory array configuration, where FIG. 15 focuses on writing and FIG. 16 focuses on erasing. The difference from FIGS. 13 and 14 is that 0 V is directly applied to the bit line BL1 connected with nonvolatile memory cells concerned in writing/erasing. As a consequence, the transistors Tr11, Tr21, Tr12 and Tr22 and related circuitry are no longer needed and the peripheral circuitry can be simpler, which means that it is possible to realize an inexpensive memory configuration which need not deliver so high performance. Even in the configuration as shown in FIGS. 15 and 16, it is possible to control the voltage of the control gate lines CG1 and CG2 to control current Ip (Ie) flowing through nonvolatile memory cells concerned in writing (erasing). Even in this case, since the voltage of the control gate lines CG1 and CG2 may be se to 1.5 V or less, it is still acceptable to use a 1.5 V logic MOS transistor for the reading system.

Figure 17:
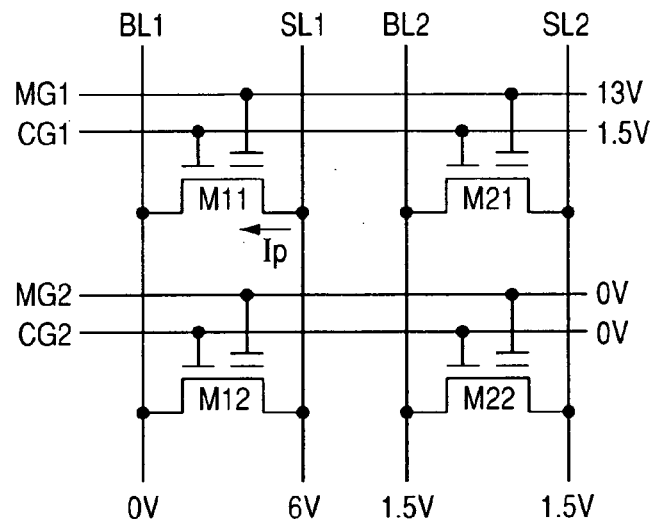
FIG. 17 is a circuit diagram showing a further concrete memory array configuration, focusing on writing.
Figure 18:
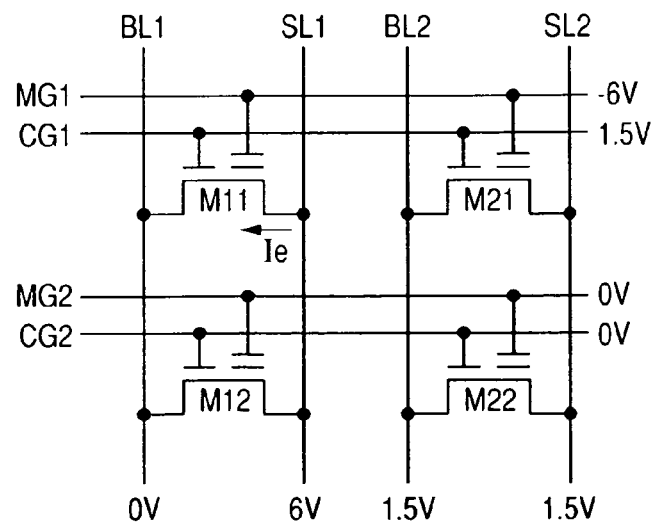
FIG. 18 is a circuit diagram showing a further concrete memory array configuration, focusing on erasing.

FIGS. 17 and 18 show another example of a concrete memory array configuration, where FIG. 17 focuses on writing and FIG. 18 focuses on erasing. The difference from FIGS. 15 and 16 is that a source line is also unshared between nonvolatile memory cells M11 and M21 in a row. Source line SLi is connected with the sources of memory cells in a column as bit line BLi. In this case, since the source voltage of nonvolatile memory cells unconcerned in writing/erasing is decreased from 6 V to 1.5 V or so, disturbance from the source side can be reduced.

Next, a configuration for controlling the bit line potential in the above flash memory on each bit line for writing/erasing will be explained.

FIGS. 19 to 23 show a first configuration for controlling the bit line potential in the above flash memory on each bit line for writing/erasing. This is based on the configuration shown in FIGS. 15 and 16.

Figure 24:
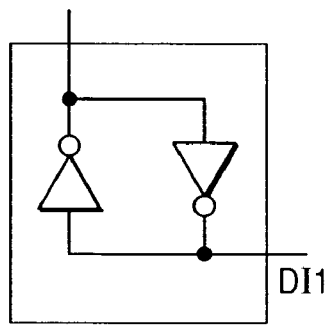
FIG. 24 is a circuit diagram illustrating a data latch in the form of a static latch.

It includes data latches DL11–DLn1 for holding new data (data to be newly written). The data latches are static latches as illustrated in FIG. 24. One input/output node of each of data latches DL11–DLn1 is connected with a corresponding input (DI1-Din). At the other input/output notches of the data latches DL11–DLn1, transistors Tr14–Trn4 which invert output of the data latches DL11–DLn1 by an inverter to supply inverted data to bit lines are provided and transistors Tr15–Trn5 which enable the other input/output nodes of the data latches DL11–DLn1 to be directly connected with bit lines are also provided. For writing, gate control signal P for the transistors Trl4–Trn4 is set to 1.5 V to turn on them. For erasing, gate control signal E for the transistors Tr15–Trn5 is set to 1.5 V to turn on them.

It is assumed that before rewriting, among typically given nonvolatile memory cells which are connected to the control gate line CG1 selected for rewriting, M11 and M21 are in the erase state and M31 and Mn1 are in the write state. Rewriting operation will be explained below by taking as an example a case that the nonvolatile memory cell M21 should be changed to the write state, the nonvolatile memory cell M31 to the erase state and the nonvolatile memory cells M11 and Mn1 should remain unchanged. The rewriting-sequence is performed in the order of steps of FIGS. 19, 20, 21 and 22 though the order of the step of FIG. 21 (erase) and the step of FIG. 22 (write) may be reversed.

Figure 19:
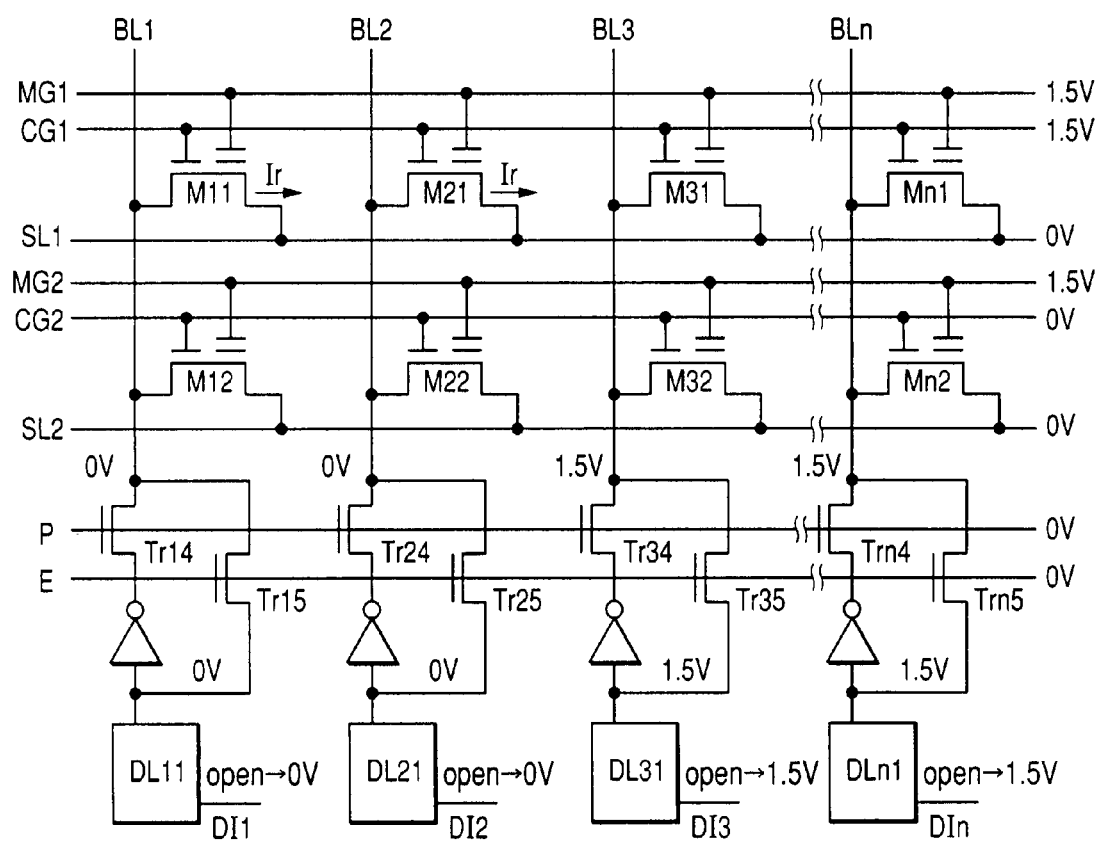
FIG. 19 is a circuit diagram showing storage of read data in latches in a first configuration for controlling the bit line potential on each bit line for writing/erasing.
Figure 20:
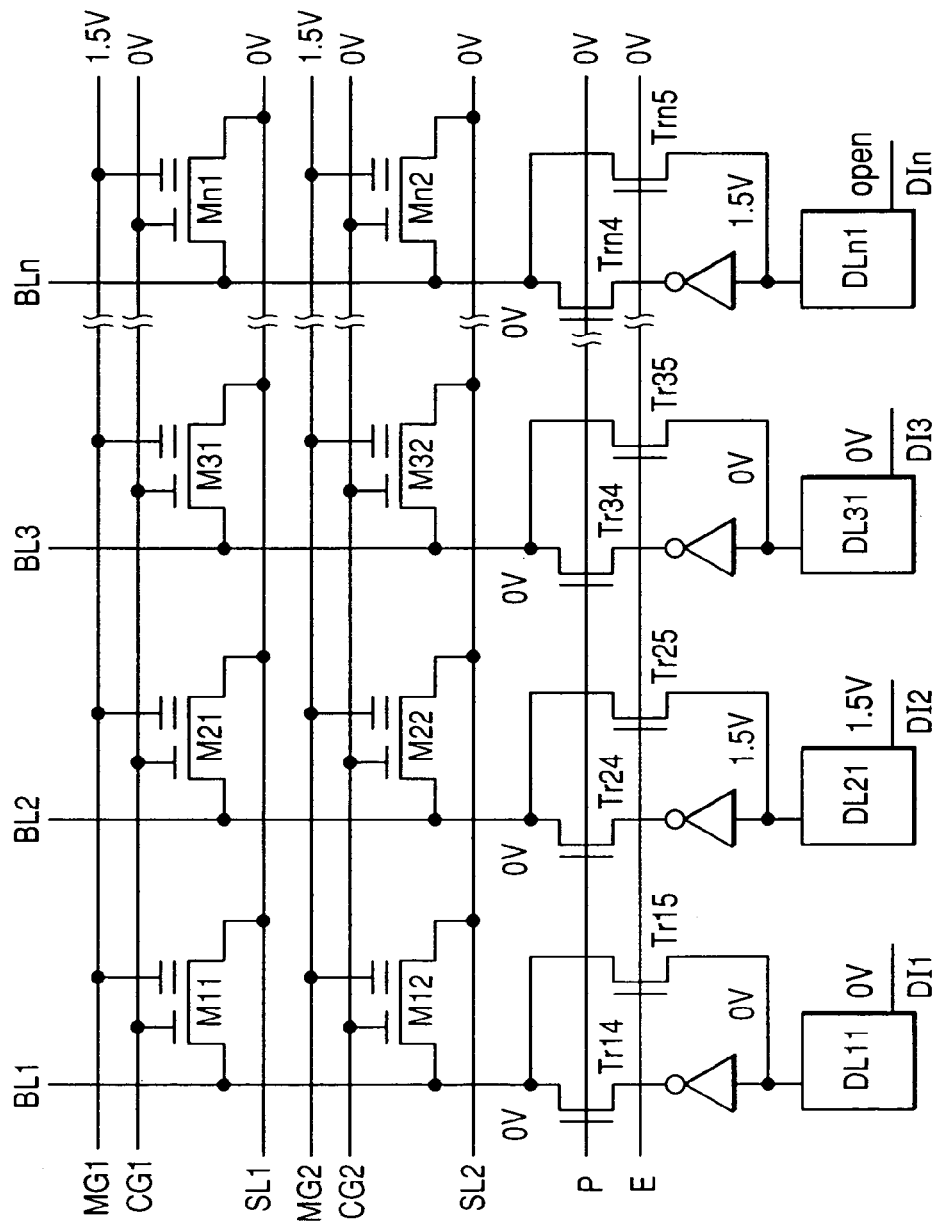
FIG. 20 is a circuit diagram showing input of new data in the first configuration for controlling the bit line potential on each bit line for writing/erasing.

First, as shown in FIG. 19, in order to hold data not to be rewritten, the data is read and stored in data latches DL11–DLn1. The data once read by a sense amplifier may be restored in data latches DL11–DLn1 by a decoding logic through input DI1-DIn, or signal E, after being set to 1.5 V, may be restored in data latches DL11–DLn1 through transistors Tr15–Trn5. The data read to data latches For instance, when the flash memory is accessed byte by byte, rewriting is also done byte by byte. Referring to FIG. 20, in connection with data latches DL11–DLn1, it is assumed that the memory cells M11–M81 are nonvolatile memory cells for 1 byte to be rewritten. 1 byte write (new) data is supplied through corresponding inputs DI1–DI8 to data latches DL11–DL81 by column addresses indicating the memory cells concerned in rewriting. This 1 byte write data is expressed as "010 . . . " At this time, the inputs of data latches DL91–DLn1 for the memory cells unconcerned in rewriting are in a high impedance state (open) and maintained as such. Referring to FIG. 20, upon input of 1 byte write data, regarding the data held by data latches DL11–DLn1 (typically given), the data held by DL21 is changed from "0" to "1" and the data held by DL31 is changed from "1" to "0". The data held by the other data latches remain unchanged.

Figure 21:
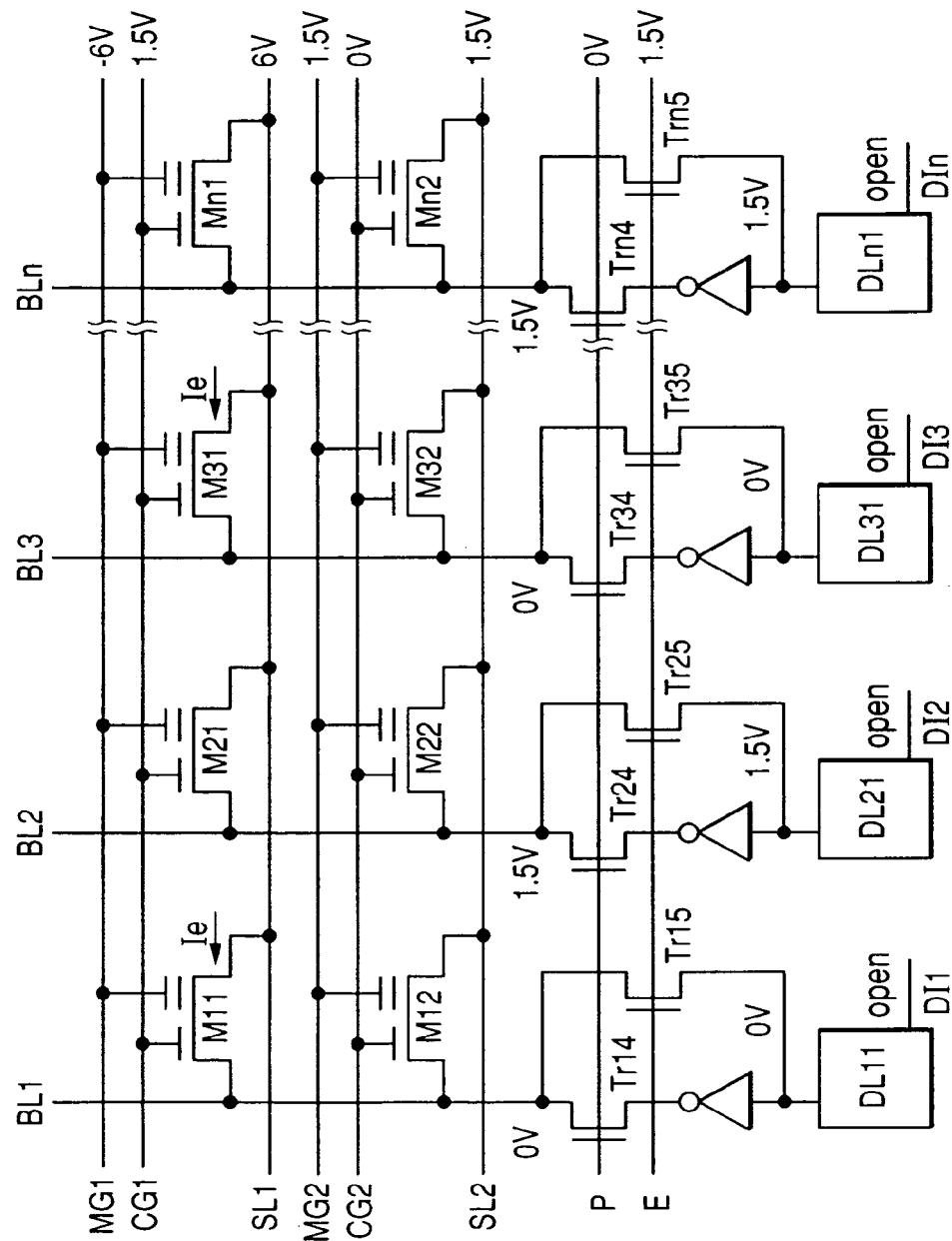
FIG. 21 is a circuit diagram showing erasing operation in the first configuration for controlling the bit line potential on each bit line for writing/erasing.

For erasing, as shown in FIG. 21, signal E is set to 1.5 V, the bit lines BL1 and BL3 are set to 0 V through the transistors Tr15 and Tr35, current Ie flows between the drain and source of each of the memory cells M11 and M31 and thus the data in M11 and M31 are erased. On the other hand, the other bit lines BL2, BLn (typically given) are set to 1.5 V through the transistors Tr25 and Trn5 and therefore no current flows between the drain and source of each of the other memory cells M21 and Mn1 (typically given) and erasing is not done. At this erasing step, the data stored in the memory cells M11, M21, M31–Mn1 change from "001–1" to "000–1".

Figure 22:
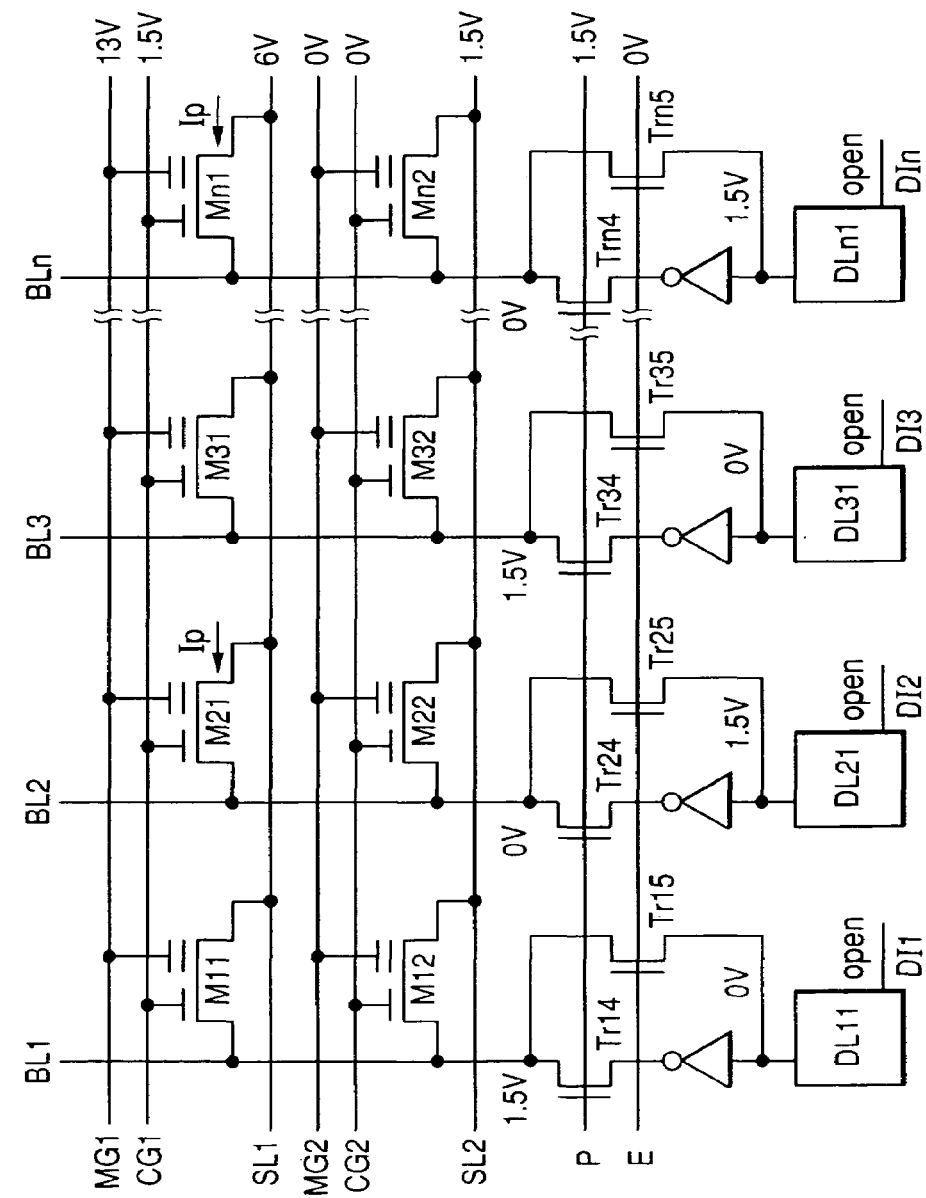
FIG. 22 is a circuit diagram showing writing operation in the first configuration for controlling the bit line potential on each bit line for writing/erasing.
Figure 23:
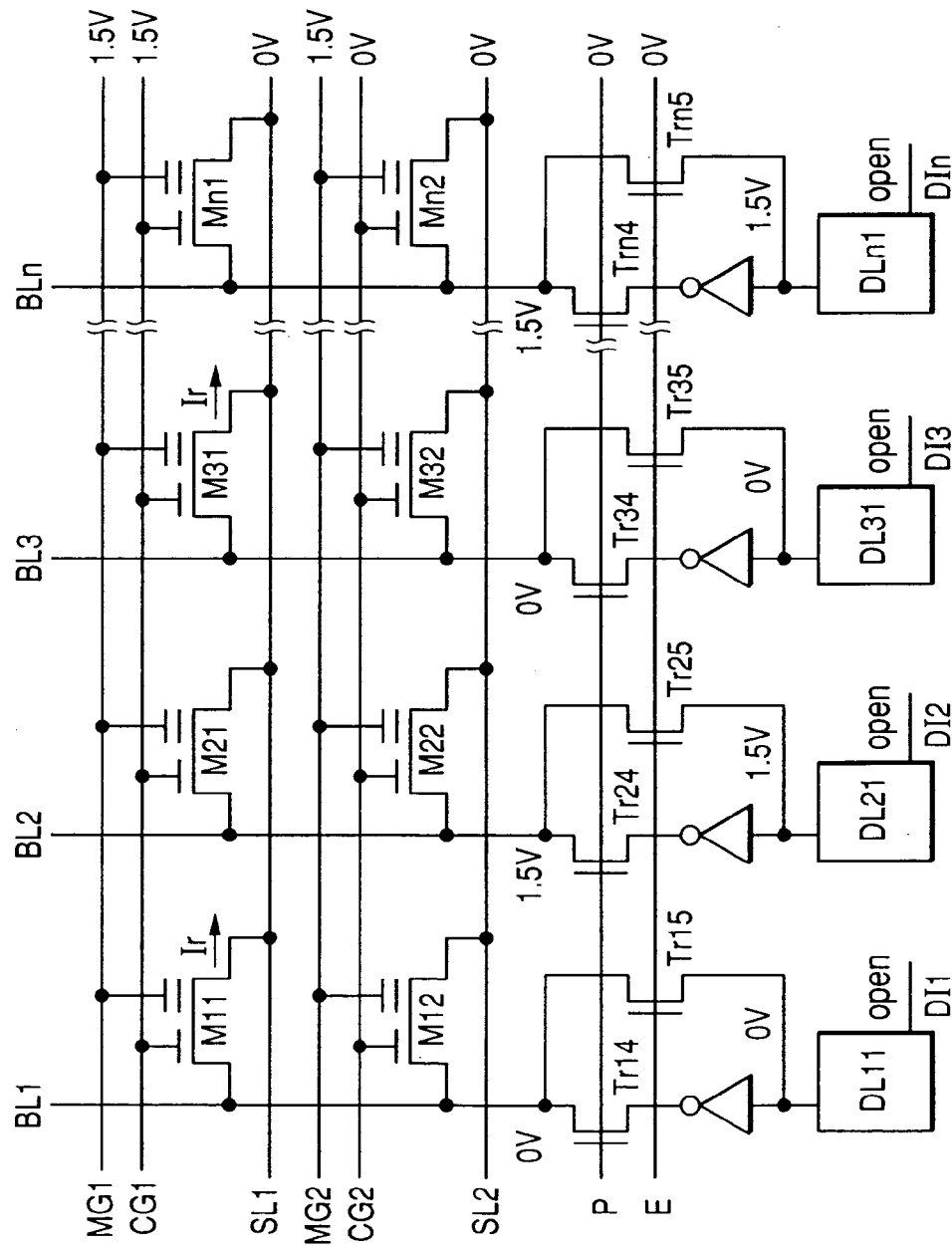
FIG. 23 is a circuit diagram showing reading operation in the first configuration for controlling the bit line potential on each bit line for writing/erasing.

For writing, as shown in FIG. 22, signal P is set to 1.5 V, the bit lines BL2 and BLn are set to 0 V through the transistors Tr24 and Trn4, current Ip flows between the drain and source of each of the memory cells M21 and Mn1 and thus data are written in M21 and Mn1. On the other hand, the other bit lines BL1 and BL3 (typically given) are set to 1.5 V through the transistors Tr14 and Tr34 and therefore no current flows between the drain and source of each of the other memory cells M11 and M31 (typically given) and writing is not done. At this writing step, the data stored in the memory cells M11, M21, M31–Mn1 change from "000–1" to "010–1".

For simpler illustration, FIGS. 19 to 23 are based on the circuitry explained in FIGS. 15 and 16. It is easy to change the circuitry to that shown in FIGS. 13 and 14; this is achieved by changing the destinations to be connected with Tr14–Trn4 and Tr15–Trn5 from bit lines BL1–BLn to signals B1, B2 and so on, and reversing the order of signals E and P. In other words, the gates of transistors Tr14–Trn4 are set to 1.5 V for erasing and the gates of Tr15–Trn5 are set to 1.5 V for writing.

Since FIG. 19 to FIG. 23 are simplified to facilitate understanding, they may be considered to indicate that the bit lines can be set to 1.5 V by Tr14–Trn4 and Tr15–Trn5; actually, however, the voltage cannot be raised to more than 1.5 V minus Vtn where Vtn represents transistor threshold voltage. The bit line voltage can be raised to 1.5 V if Tr14–Trn4 and Tr15–Trn5 are CMOS transfer gates which consist of n-channel MOS transistors and p-channel MOS transistors connected in parallel or the voltage of signals P and E can be raised to 1.5 V plus Vtn. However, when the threshold voltage of Tr14–Trn4 and Tr15–Trn5 is less than or equal to the control transistor threshold voltage, if the control transistors are to be turned off with the bit line voltage around 1.5 V, the apparent threshold voltage of the control transistors rises due to a substrate effect attributable to bit line voltage rise and the control transistors are sufficiently turned off.

Figure 25:
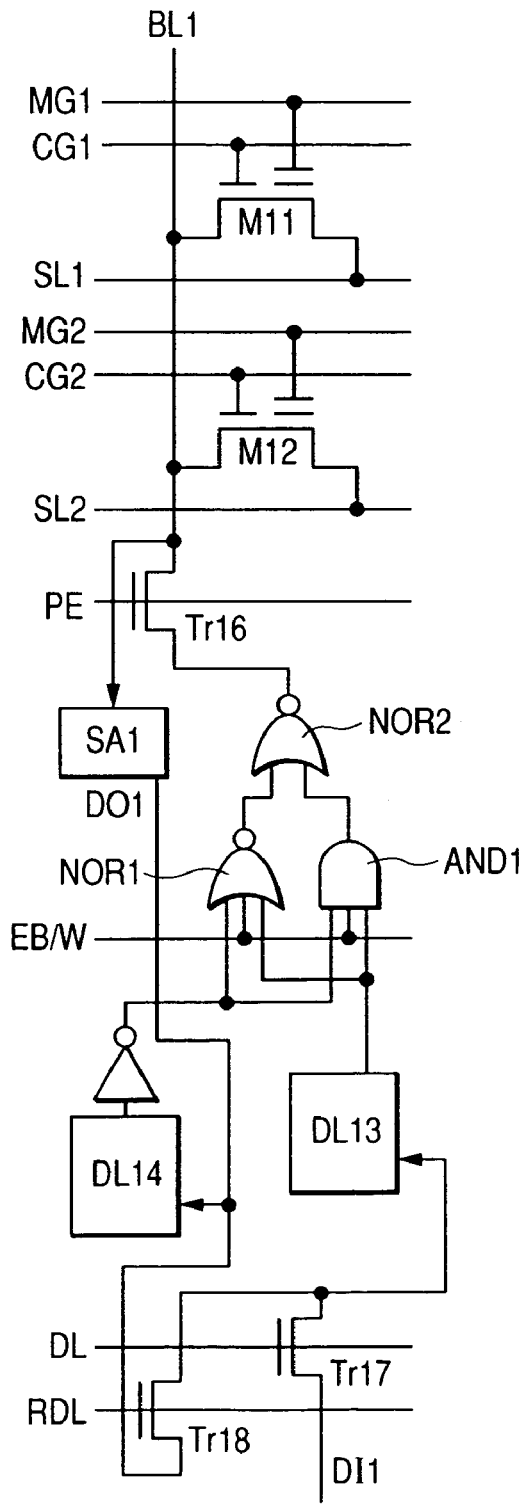
FIG. 25 is a circuit diagram illustrating a circuit for one bit (bit line) in a second configuration for controlling the bit line potential on each bit line for writing/erasing.

FIG. 25 shows a second configuration for controlling the bit line potential on each bit line for writing/erasing. In the configuration shown in FIGS. 19 to 23, erasing is done on the memory cell M11 for which erasing is substantially unnecessary and writing is done on the memory cell Mn1 for which writing is substantially unnecessary. The configuration shown in FIG. 25 is a configuration which can avoid it. The configuration shown in FIG. 25 corresponds to 1 bit and actually this configuration is repeated for each of plural bit lines.

SA1 amplifies data which has been read from a nonvolatile memory cell to the bit line BL1. One bit line has two data latches DL14 and DL13. The data latches DL14 and DL13 are static latches. The data latch DL13 can latch write data through transistor Tr17 from input line DI1. The transistor Tr17 is switched on or off according to data load signal DL. The data latches DL14 and DL13 can latch read data outputted from the sense amplifier SA1. In particular, after read data is loaded into the data latch DL13 through transistor Tr18, write data is loaded into it through transistor Tr17. The transistor Tr18 is switched on or off according to read data load signal RDL. Inverted data of output of the data latch DL13 and output of the data latch DL14 are supplied to a combination gate composed of NOR1, AND1 and NOR2 and its output is connected to the bit line BL1 through transistor Tr16. The transistor Tr16 is switched on for erasing and writing according to signal PE. The combination gate receives control signal EB/W. The control signal is set to low level ("0") for erasing and to high level ("1") for writing. Though not shown, in reading operation, the output of the sense amplifier SA1 is sent to outside through a column switch circuit (not shown). In writing operation, subject to selection by the column switch circuit (not shown), write data is supplied to input line DI1 and so forth.

In rewriting operation, stored data is read from a nonvolatile memory cell connected with a control gate line CGi selected by a row address to a bit line. At this time, signal RDL is set to 1.5 V and signal DL to 0 V and the read data is stored in the data latch DL13. At the same time, the same read data is stored in the data latch DL14. In input of new data, signal RDL is set to 0 V and signal DL to 1.5 V and when the memory cell on the bit line concerned is to be rewritten, the data latch DL13 is rewritable with new data. For erasing and writing, signals RDL and DL are both set to 0 V and signal PE is set to 1.5 V.

For erasing, signal EB/W is set to 0 V and only when the output of the data latch DL13 is 0 V and the output of the data latch DL 14 is 1.5 V, the bit line BL1 is set to 0 V. In short, erasing is done only on memory cells for which erasing is necessary where read data is "1" (corresponding to the write state) and write data is "0" (corresponding to the erase state), and no additional erasing is done on memory cells in the erase state.

For writing, signal EB/W is set to 1.5 V and only when the output of the data latch DL13 is 1.5 V and the output of the data latch DL 14 is 0 V, the bit line BL1 is set to 0 V. In short, writing is done only on memory cells for which writing is necessary where read data is "0" (corresponding to the erase state) and write data is "1" (corresponding to the write state), and no additional writing is done on memory cells in the write state.

Figure 26:
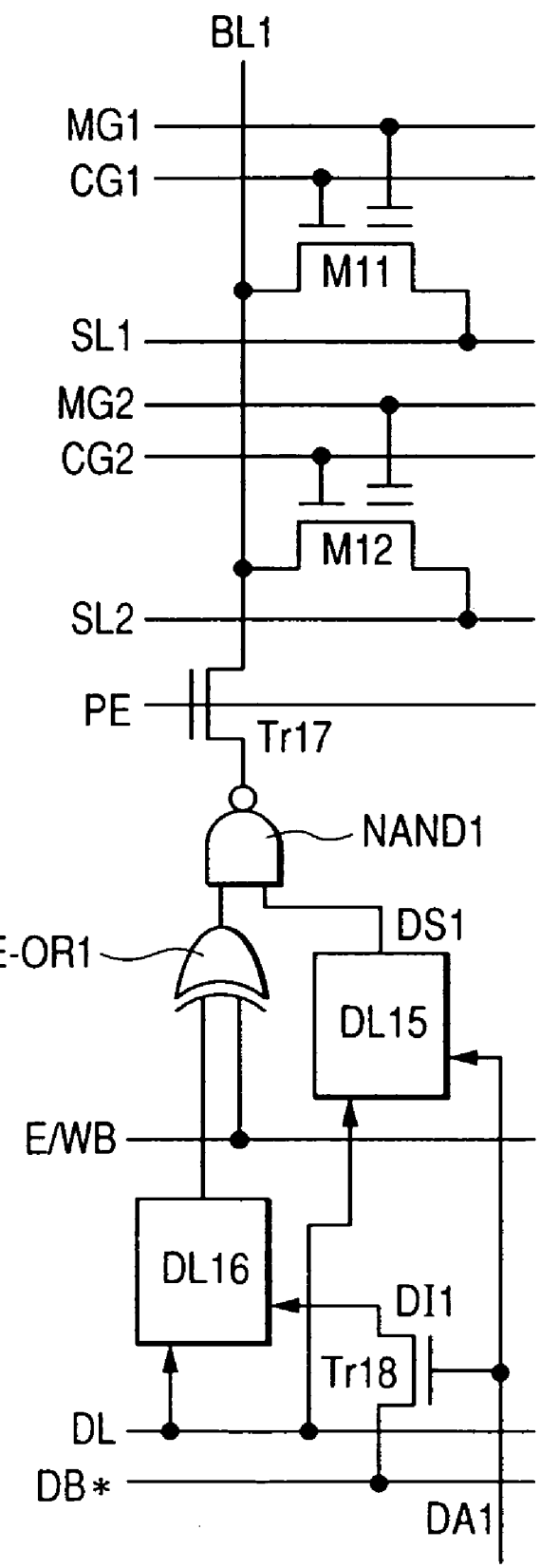
FIG. 26 is a circuit diagram illustrating a circuit for one bit on a bit line in a third configuration for controlling the bit line potential on each bit line for writing/erasing.

FIG. 26 shows a third configuration for controlling the bit line potential on each bit line for writing/erasing. Like the configuration in FIG. 25, the configuration in FIG. 26 avoids additional erasing/writing on memory cells for which erasing/writing is substantially unnecessary and also eliminates the need for reading data which is not rewritten yet. The configuration in FIG. 26 corresponds to 1 bit and actually this configuration is repeated for each of plural bit lines.

A sense amplifier for reading is omitted in the figure. One bit line has two data latches DL15 and DL16. Although not shown, the data latches DL15 and DL16 are D latches which have a reset function. The data latches DL15 and DL16 are reset just before every data loading. The data latches DL14 and DL13 latch input data when load signal LD is set to "1". The data latch DL15 latches 1-bit decode signal DA1 as a column address signal which corresponds to the bit line BL1. The selection level for the decode signal DA1 is "1". Data from bit DB* corresponding to a data bus is supplied to the data latch DL16 through MOS transistor Tr18. The transistor Tr18 is switched on or off according to the code signal DA1. In short, only when the bit line BL1 is selected for rewriting, write data is supplied to the data latch DL16. Hence, when a nonvolatile memory cell on the bit line BL1 is not to be rewritten, both data latches DL15 and DL16 hold "0", and when the nonvolatile memory cell on the bit line BL1 is to be rewritten, the data latch DL15 holds "1" and DL16 holds logical data corresponding to write data. When the data latch DL15 holds "0", NAND gate NAND1 sets the bit line BL1 to 1.5 V to prevent writing and erasing. Exclusive OR gate E-OR1 receives two inputs, signal E/WB and output of data latch DL16, and its output is sent to the NAND gate, NAND1. For erasing, signal E/WB is set to 1.5 V and when the latched data in the data latch DL16 is "0" (corresponding to the erase state), NAND gate NAND1 sets the bit line BL1 to 0 V to make it erasable. For writing, signal E/WB is set to 0 V and when the latched data in the data latch DL16 is "1" (corresponding to the write state), NAND gate NAND1 sets the bit line BL1 to 0 V to make it writable.

The data latch DL15 is previously reset so as for output DS1 to be 0 V. New data (data to be newly written) is loaded into the data latch DL16 via data bus DB*; here, DA1 is set to 1.5 V to select DL16 and at the same time, output of DL15, which has data to be rewritten and pairs with DL16, is also changed to 1.5 V.

For erasing, signal E/WE is set to 1.5 V and only when output of the data latch DL15 is 1.5 V and output of the data latch DL16 is 0 V, the bit line BL1 is 0 V. Therefore, erasing is done only on memory cells which have data to be erased.

For writing, signal E/WE is set to 0 V and only when output of the data latch DL15 is 1.5 V and output of the data latch DL16 is 1.5 V, the bit line BL1 is 0 V. Therefore, writing is done only on memory cells which have data to be rewritten.

In the configuration in FIG. 26, when data is rewritten byte by byte, in connection with byte data to be rewritten, additional erasing/writing is done on memory cells for bits where the logical values of old data bits are equal to those of new data bits. However, additional erasing/writing is never done on memory cells unconcerned in rewriting.

Figure 30:
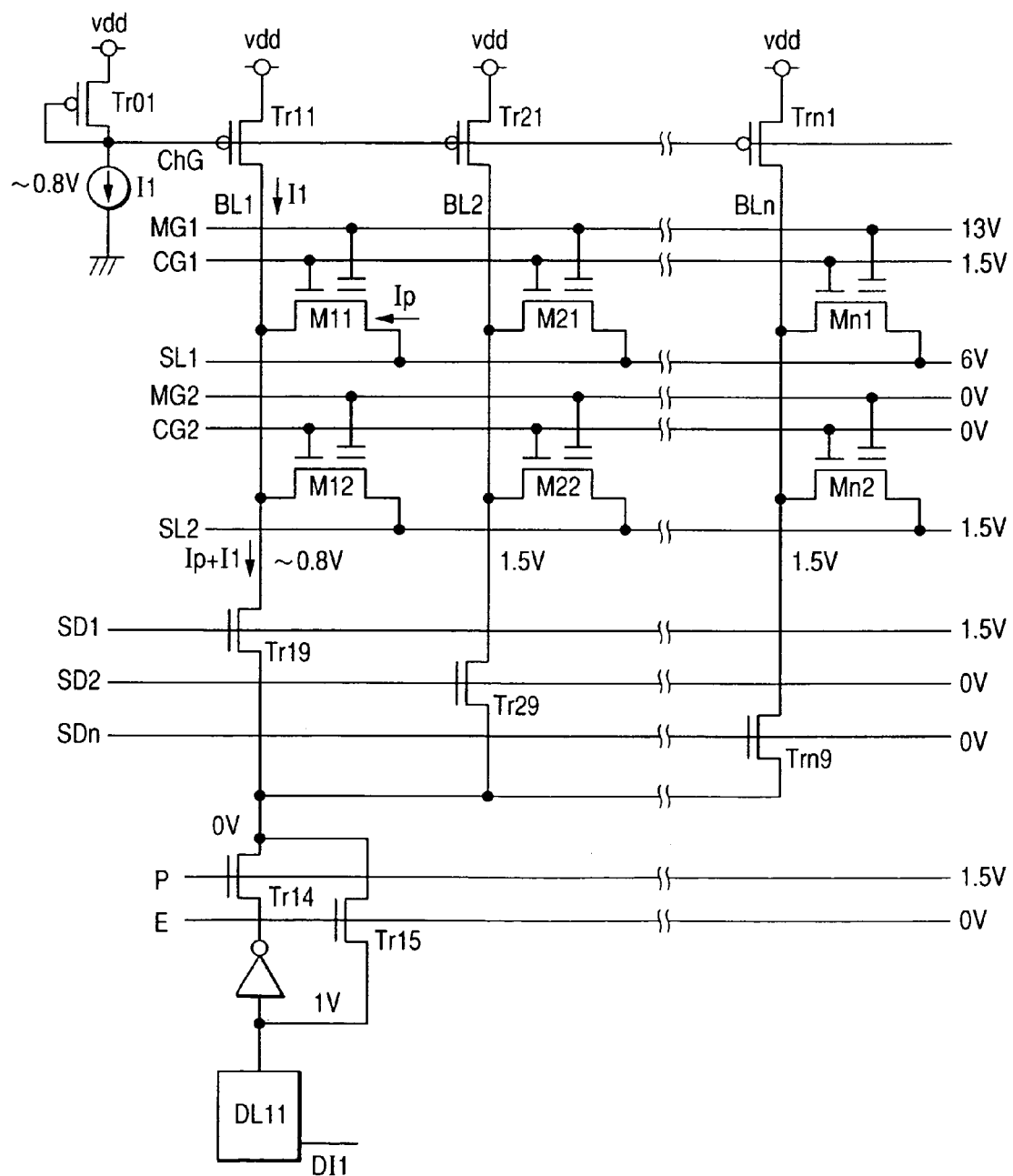
FIG. 30 is a circuit diagram showing another concrete memory array configuration, focusing on writing.
Figure 31:
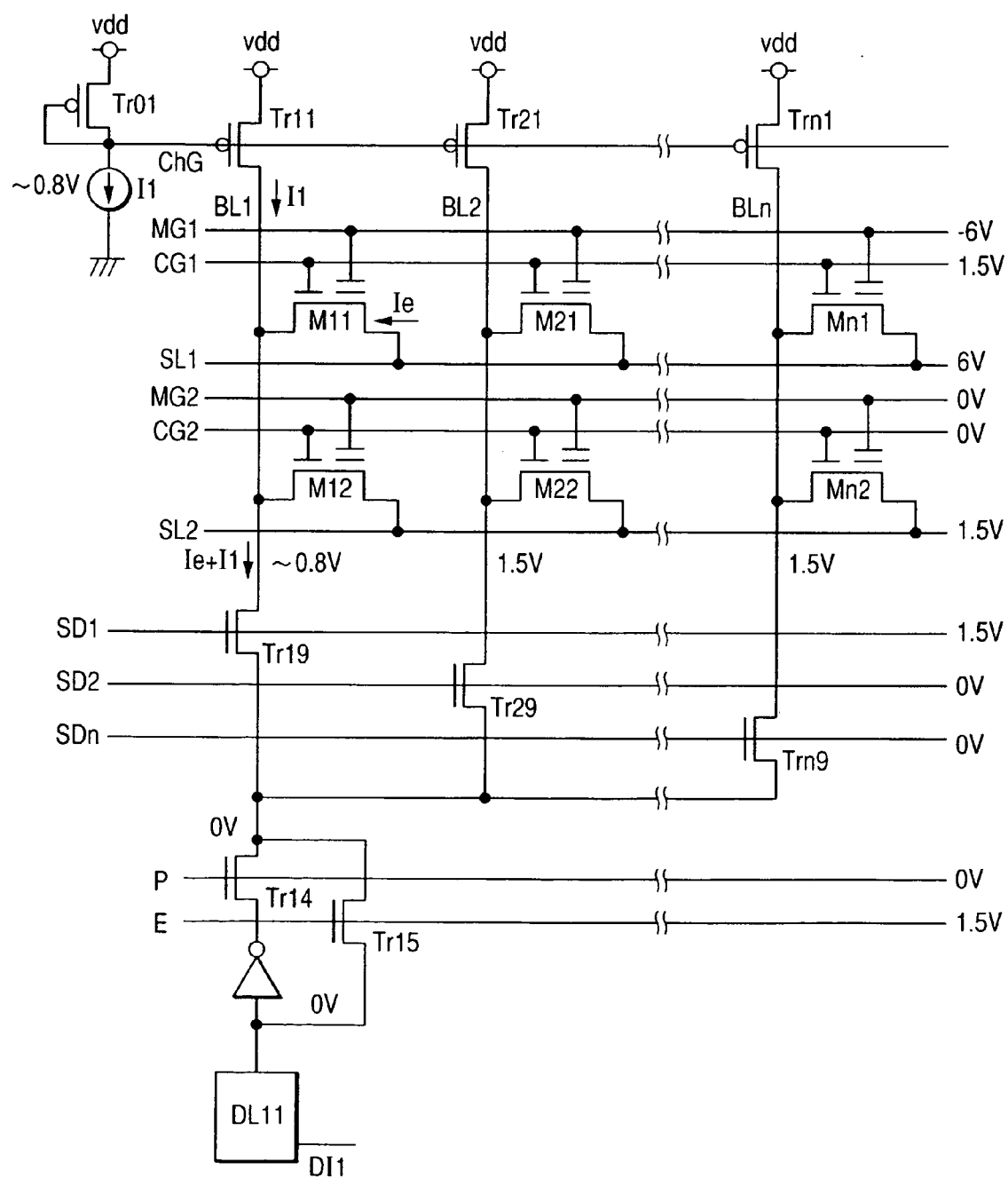
FIG. 31 is a circuit diagram showing another concrete memory array configuration, focusing on erasing.

FIGS. 30 and 31 show examples of selective use of one data latch DL11 for plural bit lines BL1–BLn. FIG. 30 shows writing operation on memory cell M11 and FIG. 31 shows erasing operation on memory cell MN1. In order to select one bit line among bit lines BL1–BLn, a selection signal (for example, 1.5 V) is supplied to one of selection signals SD1–SDn and a non-selection signal (for example, 0 V) is supplied to the other selection signals so that one of selection transistors Tr19–Trn9 turns On and the selected bit line is electrically connected with the data latch DL11. After the selected bit line is electrically connected with the data latch DL11, writing operation and erasing operation are technically similar to the writing operation and erasing operation described with reference to FIG. 22 and FIG. 21 respectively. In this configuration, when the number of bit lines is 8n and the number of data latches is 8, writing, erasing and reading on a byte basis are possible.

Figure 27:
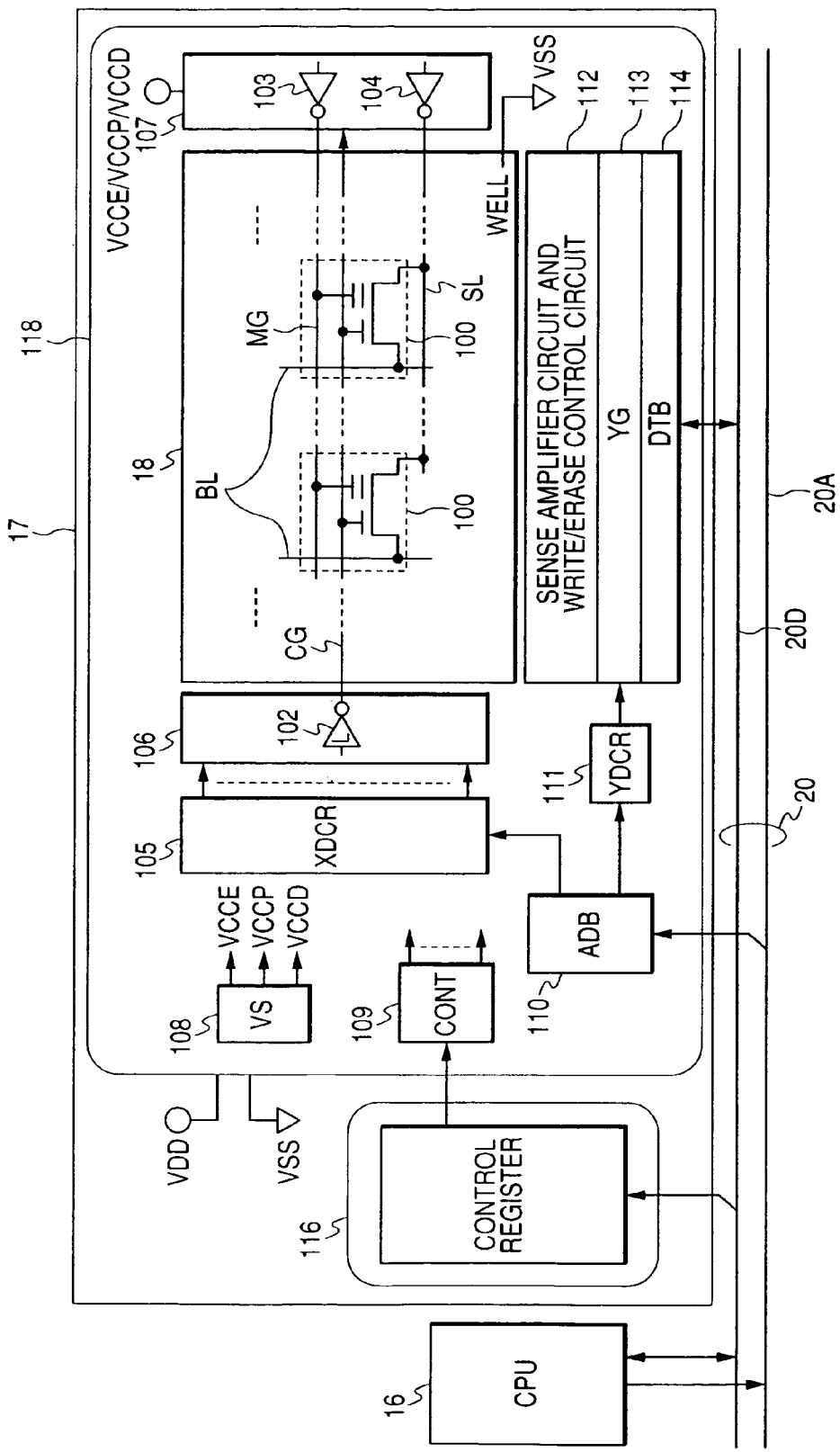
FIG. 27 is a block diagram showing details of a flash memory configuration.

FIG. 27 shows a detailed configuration of a flash memory. A memory array 18 has the abovementioned circuit configuration as shown in FIGS. 6 and 7. Nonvolatile memory cells 100 have the same structure as shown in FIG. 2. A driver circuit 106 is a circuit block including the abovementioned driver 102 where a driver which should do output operation is selected according to an address decode signal supplied from an X address decoder (XDCR) 105. A driver circuit 107 is provided with the abovementioned drivers 103 and 104 where a driver which should do output operation is selected according to the condition of a control gate control line CG or other factor. Bit lines BL are connected with a circuit block 112 which includes a sense amplifier circuit and a write/erase control circuit. The sense amplifier circuit included in the circuit block 112 amplifies read data on the bit lines and latches it. The write/erase control circuit included in the circuit block 112 latches write data in writing/erasing operation to control the potential of the bit lines BL. The circuit configurations for bit line potential control as shown in FIGS. 19 to 22, 25 and 26 are included in the write/erase control circuit. The circuit block 112 (sense amplifier circuit and write/erase control circuit) is connected through a Y selection circuit (YG) 113 to a data input/output buffer (DTB) 114 and can interface with a data bus 20D in an internal bus 20. In reading operation, the Y selection circuit 113 selects read data which has been latched by the sense amplifier circuit 112, according to an address decode signal from a Y address decoder (YDCR) 111. The selected read data can be outputted externally through a data input/output buffer 114. In writing/erasing operation, the Y selection circuit 113 controls which bit line should correspond to write data supplied from the data input/output buffer 114 which is to be latched by the write/erase control circuit 112.

An address signal is supplied from an address bus 20A to an address buffer (ADB) 110, from which it is supplied to the X address decoder 105 and the Y address decoder 111. Operating power required for reading, erasing or writing is generated by a voltage generating circuit (VS) 108 based on external power supply vdd, vss. For example, if vdd=1.5 V, the voltage generating circuit 108 generates a high voltage (13 V, 6 V, −6 V, etc).

A control circuit (CONT) 109 controls reading, erasing and writing operation control sequences and operating power switching in the flash memory module 118 according to control data set on the control register of the flash memory controller 116. Here, operating power switching refers to control for properly changing the operating power for the drivers 102–104 according to an operation mode as shown in FIGS. 19 to 23.

As shown in FIG. 27, the flash memory 17 is composed of a flash memory controller 116 and a flash memory module 118. In the flash memory (FIG. 27), elements other than the memory array 18 are considered as included in the abovementioned control circuit 19.

Figure 28:
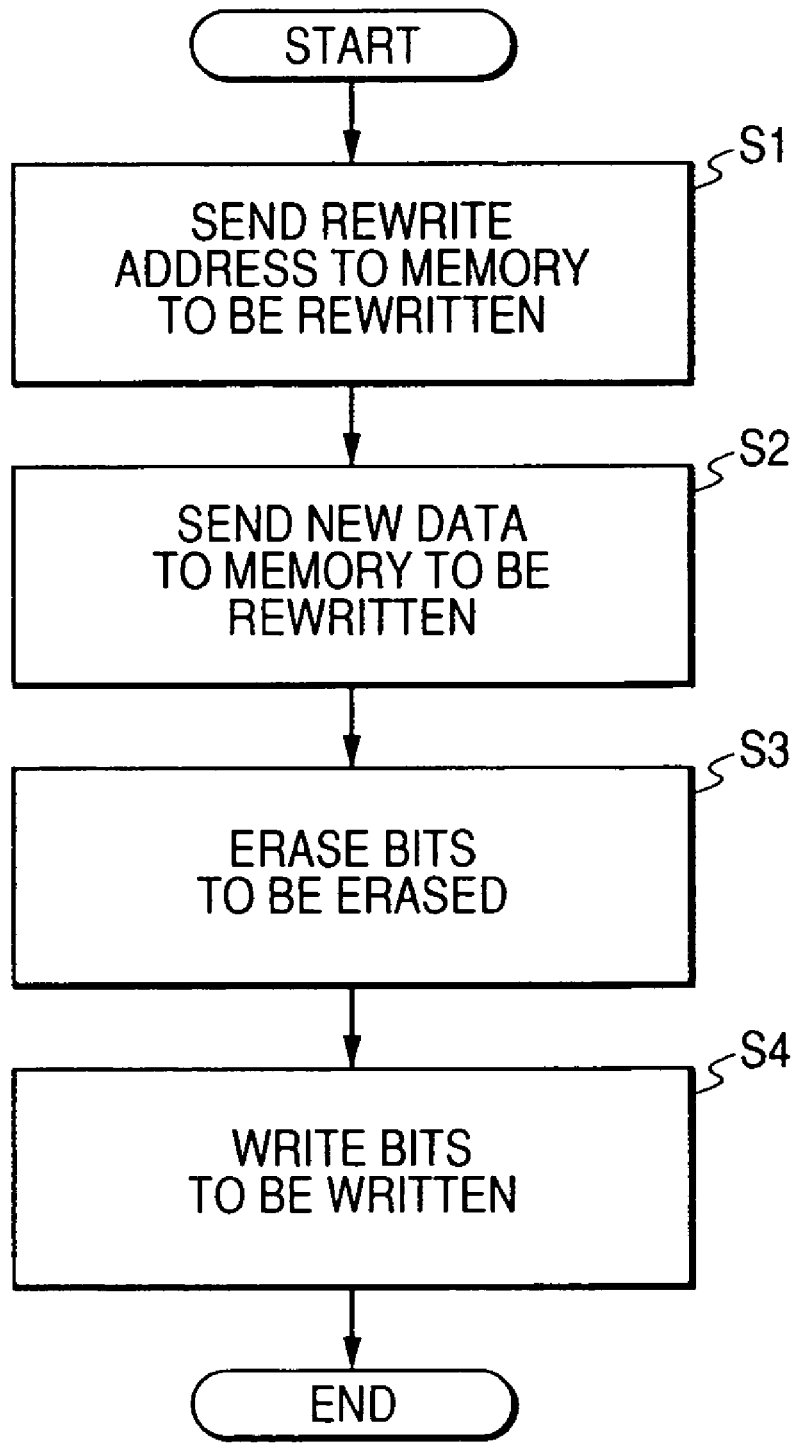
FIG. 28 is a flowchart showing an example of a rewriting sequence for a flash memory.
Figure 29:
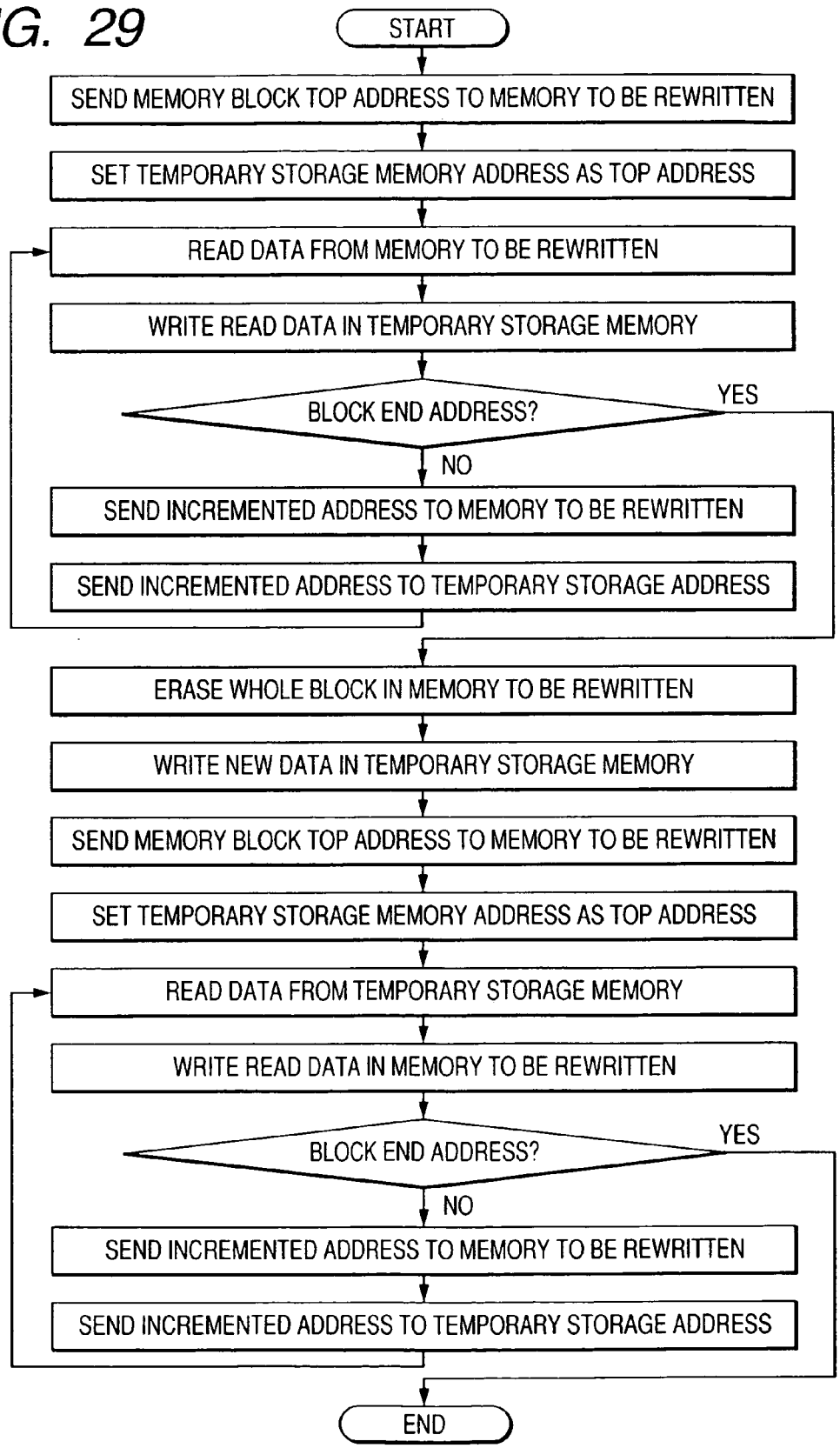
FIG. 29 is a flowchart showing a rewriting sequence according to a comparative example as a flash memory where erasing is collectively done on each memory gate and data must be read to a temporary storage memory and be again read from the temporary storage memory.

FIG. 28 shows a rewrite process flow for the flash memory 17. The CPU 16 sends a rewrite address to the flash memory 17 (S1) and sends new data (rewrite data) to the flash memory 17 (S2). Then, as it gives the flash memory 17 a command to start rewriting, the flash memory erases bits to be erased (S3) and writes bits to be written (S4) and ends the process. As apparent from this process flow, only input of data to be newly written is required as data input. In a flash memory as a comparative example in FIG. 29 where erasing is collectively done on each memory gate, it is necessary to read data into a temporary storage memory and read it again from the temporary storage memory. On the other hand, with the flash memory 17, such a process is not necessary and no temporary storage memory is needed.

In the process shown in FIG. 28, it is also acceptable to input write data (new data) before input of write address or if data and address signal lines are independent from each other, data and address may be sent concurrently. Although erasing is done before writing in the process explained so far, writing may be done before erasing. In the flash memory 17, a large difference between writing operation and erasing operation is a difference in memory gate input voltage and therefore the result should be the same even if the order is reversed. On the other hand, in case of a flash memory which only supports collective erasure, if the order of writing and erasing should be reversed, the result might not be the same.

According to the flash memory explained above, just by changing the drain side voltage, selective writing or erasing can be concurrently done on plural memory cells which share a source, control gate and memory gate. Erasure on a bit-by-bit basis can be done just by adding peripheral circuitry capable of applying negative voltage to the memory gate. Therefore, a smaller low-price chip can be realized. In addition, since a common memory can be used for the memory array and the memory dedicated to block erasure, man-hours for development can be decreased. Writing or erasing can be done on the minimum number of memory cells for which writing or erasing is necessary, which means that it is possible to avoid writing or erasing on memory cells for which writing or erasing is basically unnecessary. Consequently, power consumption is reduced and writing or erasing velocity is increased. The number of rewriting operations is minimized so that memory characteristic deterioration due to repeated rewriting is retarded and data storage reliability is improved.

When the flash memory is used for an on-chip flash memory of a microcomputer or the like, it increases the velocity of random access rewriting and is suitable for holding rewritable data or partial program revision.

Since bit-by-bit erasure is possible, it is only necessary to input new data (rewrite data) and its address once. This implies that the rewriting velocity is higher than in a configuration which enables block-by-block rewriting and a memory for data storage is no longer needed, leading to a low price flash memory.

The invention made by the present inventors has been concretely described with reference to preferred embodiments thereof. The present invention is not limited thereto but may be embodied in various other forms without departing from the spirit and scope thereof.

For instance, $Al_2O_3$ or $HfO_2$ may be used instead of nitride in the ONO film as the charge retention layer of a nonvolatile memory cell. It is also possible to adopt another structure which allows charge retention such as a structure with semiconductor or metal particles dispersed in insulating material. Data which is stored in nonvolatile memory cells is not limited to binary data but may also be quaternary data or the like. Writing or erasing voltage is not limited to the abovementioned and may be modified as necessary. For example, the memory gate voltage may be not 0 V but a voltage which minimizes disturbance (for example, 1.5 V). Also, when signals B1, B2 and so forth are all 1.5 V, an operation equivalent to collective or whole block erasure can be selectively performed. Therefore, even in a system which uses a conventional collective erasure type memory, the above flash memory can be used without the need for modifying the program and circuit configuration.

The present invention can be widely applied to nonvolatile memories or flash memories which can be rewritten bit by bit or byte by byte, nonvolatile memories which are mounted on data processing LSIs such as microcomputers, system on-chip LSIs including nonvolatile memories and the like.

What is claimed is:

1. A data processing device comprising:
a nonvolatile memory provided with a memory array; and
a controller,
wherein the memory array includes a plurality of nonvolatile memory cells each having a pair of a first MOS transistor and a second MOS transistor, the first MOS transistor, which is used for data storing, having a charge retention layer and a memory gate, and the second MOS transistor having a control gate to selectively connect the first MOS transistor to a bit line, and
wherein the controller enables emission of electrons held in a charge retention layer using hot carriers generated in a nonvolatile memory cell channel region by application of negative voltage to the memory gate, enables injection of electrons into the charge retention layer using hot carriers generated in the nonvolatile memory cell channel region by application of positive voltage to the memory gate, and controls the generation and suppression of hot carriers by a bit line voltage on each bit line.

2. The data processing device according to claim 1, further comprising a data latch circuit,
wherein, for data rewriting, the controller enables stored data in a nonvolatile memory cell of the plurality of nonvolatile memory cells to be latched by a corresponding data latch circuit through a bit line and updates, among the latched stored data, data to be rewritten with newly written data and controls generation and suppression of hot carriers for a corresponding nonvolatile memory cell according to the logical value of each bit of the updated latched data.

3. The data processing device according to claim 1, further comprising:
a first data latch circuit; and
a second data latch circuit,
wherein, for data rewriting, the controller enables stored data in a nonvolatile memory cell to be latched by a corresponding first data latch circuit and a corresponding second data latch circuit through a bit line, then updates the data to be rewritten, among the data latched by the second data latch circuit, with newly written data and allows generation of hot carriers for a nonvolatile memory cell which corresponds to a bit for which the updated data latched by the second data latch circuit and the data latched by the first data latch circuit do not agree.

4. The data processing device according to claim 1, further comprising:
a first data latch circuit; and
a second data latch circuit,
wherein the first data latch circuit and the second data latch circuit are each connected to a nonvolatile memory cell through a corresponding bit line; and
wherein, for data rewriting, the controller initializes the first data latch circuit and the second data latch circuit to a first logical value for each bit and updates the data to be rewritten, in the initialized first data latch circuit, with newly written data, and updates the data to be rewritten, in the initialized second data latch circuit, to a second logical value, and allows generation of hot carriers for a nonvolatile memory cell corresponding to a bit for which the updated data latched by the second data latch circuit and the data latched by the first data latch circuit have both the second logical value.

5. The data processing device according to claim 1, further comprising a logical unit which can access the nonvolatile memory.

6. The data processing device according to claim 5, wherein, when accessing the nonvolatile memory for writing, the logical unit gives the nonvolatile memory a destination address for writing, write data and a writing operation command.

7. The data processing device according to claim 1, wherein, for rewriting stored data in nonvolatile memory cells, the controller omits the step of reading stored data from nonvolatile memory cells to be rewritten and suppresses generation of hot carriers for nonvolatile memory cells not to be rewritten, as indicated by address information.

* * * * *